United States Patent
Suresh et al.

(10) Patent No.: US 12,219,004 B2
(45) Date of Patent: *Feb. 4, 2025

(54) SYSTEMS AND METHODS FOR COMMUNICATION EFFICIENT DISTRIBUTED MEAN ESTIMATION

(71) Applicant: Google LLC, Mountain View, CA (US)

(72) Inventors: Ananda Theertha Suresh, New York, NY (US); Sanjiv Kumar, Jericho, NY (US); Hugh Brendan McMahan, Seattle, WA (US); Xinnan Yu, Forest Hills, NY (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/240,799

(22) Filed: Aug. 31, 2023

(65) Prior Publication Data

US 2024/0098138 A1 Mar. 21, 2024

Related U.S. Application Data

(63) Continuation of application No. 17/502,794, filed on Oct. 15, 2021, now Pat. No. 11,785,073, which is a
(Continued)

(51) Int. Cl.
*G06N 20/00* (2019.01)
*G06F 17/12* (2006.01)
(Continued)

(52) U.S. Cl.
CPC ............ *H04L 67/10* (2013.01); *G06F 17/12* (2013.01); *G06F 17/16* (2013.01); *G06F 17/18* (2013.01);
(Continued)

(58) Field of Classification Search
CPC ........... G07N 7/01; G06F 17/12; G06F 17/16; H03M 7/3082; H03M 7/40; H04L 67/01
See application file for complete search history.

(56) References Cited

U.S. PATENT DOCUMENTS

| 6,687,653 B1 | 2/2004 | Kurien et al. |
| 6,708,163 B1 | 3/2004 | Kargupta et al. |

(Continued)

FOREIGN PATENT DOCUMENTS

WO WO 2015/126858 8/2015

OTHER PUBLICATIONS

Ailon et al., "Approximate Nearest Neighbors and the Fast Johnson-Lindenstrauss Transform", Thirty-eighth Annual Association for Computing Machinery Symposium on Theory of Computing, Seattle, Washington, United States, May 21-23, 2006, 7 pages.
(Continued)

*Primary Examiner* — Kevin W Figueroa
(74) *Attorney, Agent, or Firm* — DORITY & MANNING P.A.

(57) ABSTRACT

The present disclosure provides systems and methods for communication efficient distributed mean estimation. In particular, aspects of the present disclosure can be implemented by a system in which a number of vectors reside on a number of different clients, and a centralized server device seeks to estimate the mean of such vectors. According to one aspect of the present disclosure, a client computing device can rotate a vector by a random rotation matrix and then subsequently perform probabilistic quantization on the rotated vector. According to another aspect of the present disclosure, subsequent to quantization but prior to transmission, the client computing can encode the quantized vector according to a variable length coding scheme (e.g., by computing variable length codes).

20 Claims, 6 Drawing Sheets

Related U.S. Application Data continuation of application No. 15/708,793, filed on Sep. 19, 2017, now Pat. No. 11,196,800, which is a continuation-in-part of application No. 15/676,076, filed on Aug. 14, 2017, now abandoned.

(60) Provisional application No. 62/400,019, filed on Sep. 26, 2016.

(51) Int. Cl.

| | |
|---|---|
| G06F 17/16 | (2006.01) |
| G06F 17/18 | (2006.01) |
| G06N 7/01 | (2023.01) |
| H03M 7/30 | (2006.01) |
| H03M 7/40 | (2006.01) |
| H04L 67/10 | (2022.01) |
| H04L 67/01 | (2022.01) |

(52) U.S. Cl.
CPC ............... *G06N 7/01* (2023.01); *G06N 20/00* (2019.01); *H03M 7/3059* (2013.01); *H03M 7/3082* (2013.01); *H03M 7/40* (2013.01); *H04L 67/01* (2022.05)

(56) References Cited

U.S. PATENT DOCUMENTS

| | | | |
|---|---|---|---|
| 6,879,944 | B1 | 4/2005 | Tipping et al. |
| 7,069,256 | B1 | 6/2006 | Campos |
| 7,664,249 | B2 | 2/2010 | Horvitz et al. |
| 8,018,874 | B1 | 9/2011 | Owechko |
| 8,239,396 | B2 | 8/2012 | Byun et al. |
| 8,321,412 | B2 | 11/2012 | Yang et al. |
| 8,429,103 | B1 | 4/2013 | Aradhye et al. |
| 8,954,357 | B2 | 2/2015 | Faddoul et al. |
| 9,190,055 | B1 | 11/2015 | Kiss et al. |
| 9,275,398 | B1 | 3/2016 | Kumar et al. |
| 9,336,483 | B1 | 5/2016 | Abeysooriya et al. |
| 9,390,370 | B2 | 7/2016 | Kingsbury |
| 9,424,836 | B2 | 8/2016 | Lee et al. |
| 2005/0138571 | A1 | 6/2005 | Keskar et al. |
| 2006/0146692 | A1 | 7/2006 | Gorokhov et al. |
| 2006/0224579 | A1 | 10/2006 | Zheng |
| 2008/0209031 | A1 | 8/2008 | Zhu et al. |
| 2010/0132044 | A1 | 5/2010 | Kogan et al. |
| 2011/0085546 | A1 | 4/2011 | Capello et al. |
| 2012/0016816 | A1 | 1/2012 | Yanase et al. |
| 2012/0226639 | A1 | 9/2012 | Burdick et al. |
| 2012/0310870 | A1 | 12/2012 | Caves et al. |
| 2014/0214735 | A1 | 7/2014 | Harik |
| 2014/0294310 | A1 | 10/2014 | Armano et al. |
| 2015/0186798 | A1 | 7/2015 | Vasseur et al. |
| 2015/0193695 | A1 | 7/2015 | Cruz Mota et al. |
| 2015/0195144 | A1 | 7/2015 | Vasseur et al. |
| 2015/0242760 | A1 | 8/2015 | Miao et al. |
| 2015/0324690 | A1 | 11/2015 | Chilimbi et al. |
| 2018/0018590 | A1 | 1/2018 | Szeto et al. |

OTHER PUBLICATIONS

Ailon et al., "Fast Dimension Reduction Using Rademacher Series on Dual BCH Codes." Discrete & Computational Geometry, 2009, 615-630, 16 pages.

Alistarh et al., "QSGB: Randomized Quantization for Communication-Optimal Stochastic Gradient Descent", arXiv:610.02132v1, Oct. 7, 2016, 22 pages.

Al-Rfou et al., "Conversational Contextual Cues: The Case of Personalization and History for Response Ranking", arXiv:1606.00372v1, Jun. 1, 2016, 10 pages.

Arjevani et al., "Communication Complexity of Distributed Convex Learning and Optimization", Neural Information Processing Systems, Montreal, Canada, Dec. 7-12, 2015, 9 pages.

Balcan et al., "Distributed Learning, Communication Complexity and Privacy", Conference on Learning Theory, Edinburgh, Scotland, Jun. 25-27, 2012.

Bonawitz et al., "Practical Secure Aggregation for Federated Learning on User-Held Data", arXiv1611.04482v1, Nov. 14, 2016, 5 pages.

Bouchoucha et al., "Distributed Estimation Based on Observations Prediction in Wireless Sensor Networks", Institute of Electrical and Electronics Engineers Signal Processing Letters, vol. 22, Issue 10, Oct. 2015, pp. 1530-1533.

Braverman et al., "Communication Lower Bounds for Statistical Estimation Problems via a Distributed Data Processing Inequality", Forty-eighth Annual Association for Computing Machinery Symposium on Theory of Computing, Cambridge, Massachusetts, United States, Jun. 19-21, 2016, pp. 1011-1020, 11 pages.

Chaudhuri et al., "Differentially Private Empirical Risk Minimization", Journal of Machine Learning Research, vol. 12, Jul. 12, 2011, pp. 1069-1109.

Chen et al., "Communication-Optimal Distributed Clustering", Neural Information Processing Systems, Barcelona, Spain, Dec. 5-10, 2016, 9 pages.

Chen et al., "Revisiting Distributed Synchronous SGD", arXiv:1604.00981v3, Mar. 21, 2017, 10 pages.

Chilimbi et al., "Project Adam: Building an Efficient and Scalable Deep Learning Training System", Eleventh USENIX Symposium on Operating Systems Design and Implementation, Broomfield, Colorado, United States, Oct. 6-8, 2014, pp. 571-582.

European Search Report for Application No. 16856233.8, mailed on Nov. 20, 2018, 9 pages.

Dasgupta et al., "An Elementary Proof of a Theorem of Johnson and Lindenstrauss", Random Structures & Algorithms, vol. 22, Issue 1, 2003, pp. 60-65.

Dean et al., "Large Scale Distributed Deep Networks", Neural Information Processing Systems, Lake Tahoe, Nevada, United States, Dec. 3-6, 2012, pp. 1223-1231.

Denil et al., "Predicting Parameters in Deep Learning", Twenty-sixth International Conference on Neural Information Processing Systems, Lake Tahoe, Nevada, United States, Dec. 5-10, 2013, pp. 2148-2156.

Duchi et al., "Privacy Aware Learning", arXiv:1210.2085v2, Oct. 10, 2013, 60 pages.

Dwork et al., "The Algorithmic Foundations of Differential Privacy", Foundations and Trends in Theoretical Computer Science, vol. 9, No. 3-4, 2014, pp. 211-407.

Efron et al., "The Jackknife Estimate of Variance", The Annals of Statistics, vol. 9, Issue 3, May 1981, pp. 586-596.

Elias, "Universal Codeword Sets and Representations of the Integers", Institute of Electrical and Electronics Engineers Transactions on Information Theory, vol. 21, Issue 2, Mar. 1975, pp. 194-203.

Falahatgar et al., "Universal Compression of Power-Law Distributions", arXiv:1504.08070v2, May 1, 2015, 20 pages.

Fercoq et al., "Fast Distributed Coordinate Descent for Non-Strongly Convex Losses", arXiv:1405.5300v1, May 21, 2014, 6 pages.

Gamal et al., "On Randomized Distributed Coordinate Descent with Quantized Updates", arXiv:1609.05539v1, Sep. 18, 2016, 5 pages.

Garg et al., "On Communication Cost of Distributed Statistical Estimation and Dimensionality", Neural Information Processing Systems, Montreal, Canada, Dec. 8-13, 2014, 9 pages.

Golovin et al., "Large-Scale Learning with Less Ram via Randomization", arXiv:1303.4664v1, Mar. 19, 2013, 10 pages.

Gubner. "Distributed Estimation and Quantization." Institute of Electrical and Electronics Engineers Transactions on Information Theory, vol. 39, Issue 4, Jul. 1993, pp. 1456-1459.

Han et al., "Deep Compression: Compressing Deep Neural Networks with Pruning, Trained Quantization and Huffman Coding", arXiv:1510.00149v5, Nov. 20, 2015, 13 pages.

Ho et al., "More Effective Distributed ML via a Stale Synchronous Parallel Parameter Server", Neural Information Processing Systems, Dec. 5-10, 2013, Lake Tahoe, Nevada, United States, 9 pages.

Horadam, "Hadamard Matrices and Their Applications", Princeton University Press, 2007.

(56) References Cited

OTHER PUBLICATIONS

Jaggi et al., "Communication-Efficient Distributed Dual Coordinate Ascent", arXiv:1409.1458v2, Sep. 29, 2014, 15 pages.
Johnson et al., "Accelerating Stochastic Gradient Descent Using Predictive Variance Reduction" Advances in Neural Information Processing Systems, Lake Tahoe, Nevada, United States, Dec. 5-10, 2013, pp. 315-323.
Kalantidis et al., "Locally Optimized Product Quantization for Approximate Nearest Neighbor Search." Institute of Electrical and Electronics Engineers Conference on Computer Vision and Pattern Recognition, 2014, 8 pages.
Konecny et al., "Federated Learning: Strategies for Improving Communication Efficiency", arXiv:610.05492v1, Oct. 18, 2016, 5 pages.
Konecny et al., "Federated Optimization: Distributed Machine Learning for On-Device Intelligence", arXiv:1610.02527v1, Oct. 8, 2016, 38 pages.
Konecny et al., "Federated Optimization: Distributed Optimization Beyond the Datacenter", arXiv:1511.03575v1, Nov. 11, 2015, 5 pages.
Konecny et al., "Randomized Distributed Mean Estimation: Accuracy vs. Communication", arXiv:1611.07555v1, Nov. 22, 2016, 19 pages.
Konecny et al., "Semi-Stochastic Gradient Descent Methods", arXiv:1312.1666v1, Dec. 5, 2013, 19 pages.
Krizhevsky, "Learning Multiple Layers of Features from Tiny Images", Technical Report, Apr. 8, 2009, 60 pages.
Krizhevsky, "One Weird Trick for Parallelizing Convolutional Neural Networks", arXiv:1404.59997v2, Apr. 26, 2014, 7 pages.
Krichevsky et al., "The Performance of Universal Encoding", Institute of Electrical and Electronics Engineers Transactions on Information Theory, vol. 27, Issue 2, Mar. 1981, pp. 199-207.
Kumar et al., "Fugue: Slow-Worker-Agnostic Distributed Learning for Big Models on Big Data", Journal of Machine Learning Research: Workshop and Conference Proceedings, Apr. 2014, 9 pages.
Livni et al., "An Algorithm for Training Polynomial Networks", arXiv:1304.7045v1, Apr. 26, 2013, 22 pages.
Livni et al., "On the Computational Efficiency of Training Neural Networks" arXiv:1410.1141v2, Oct. 28, 2014, 15 pages.
Lloyd, "Least Squares Quantization in PCM", Institute of Electrical and Electronics Engineers Transactions on Information Theory, vol. 28, Issue 2, Mar. 1982, pp. 129-137.
Ma et al., "Adding vs. Averaging in Distributed Primal-Dual Optimization", arXiv:1502.03508v2, Jul. 3, 2015, 19 pages.
Ma et al., "Distributed Optimization with Arbitrary Local Solvers", arXiv:1512.04039v2, Aug. 3, 2016, 38 pages.
MacKay, "Information Theory, Inference and Learning Algorithms", Cambridge University Press, 2003.
Mahajan, et al., "A Functional Approximation Based Distributed Learning Algorithm", Oct. 31, 2013, https://arXiv.org/pdf/1310.8418v1, retrieved on Nov. 15, 2018.
Mahajan, et al., "An Efficient Distributed Learning Algorithm Based on Approximations", Journal of Machine Learning Research, Mar. 16, 2015, pp. 1-32, https://arXiv.org/pdf/1310.8418.pdf, retrieved on Nov. 15, 2018.
McDonald et al., "Distributed Training Strategies for the Structures Perceptron", Human Language Technologies: The 2010 Annual Conference of the North American Chapter of the Association for Computational Linguistics, Los Angeles, California, United States, Jun. 2-4, 2010, 9 pages.
McMahan et al., "Communication-Efficient Learning of Deep Networks from Decentralized Data", arXiv:1602.05629v3, Feb. 28, 2017, 11 pages.
McMahan et al., "Federated Learning: Collaborative Machine Learning without Centralized Training Data", Apr. 6, 2017, https://research.googleblog.com/2017/04/federated-learning-collaborative.html, retrieved on Oct. 3, 2018, 5 pages.
McMahan et al., "Federated Learning of Deep Networks using Model Averaging", arXiv:1602.05629, Feb. 17, 2016, 11 pages.
Povey et al., "Parallel Training of Deep Neural Networks with Natural Gradient and Parameter Averaging", arVix:1410.7455v1, Oct. 27, 2014, 21 pages.
Qu et al., "Coordinate Descent with Arbitrary Sampling I: Algorithms and Complexity", arXiv:1412.8060v2, Jun. 15, 2015, 32 pages.
Qu et al., Quartz: Randomized Dual Coordinate Ascent with Arbitrary Sampling, arXiv:1411.5873v1, Nov. 21, 2014, 34 pages.
Rabbat et al., "Quantized Incremental Algorithms for Distributed Optimization", Journal on Selected Areas in Communications, vol. 23, No. 4, 2005, pp. 798-808.
Reddi et al., "AIDE: Fast and Communication Efficient Distributed Optimization", arXiv:1608.06879v1, Aug. 24, 2016, 23 pages.
Richtarik et al., "Distributed Coordinate Descent Method for Learning with Big Data", arXiv:1310.2059v1, Oct. 8, 2013, 11 pages.
Seide et al., "1-Bit Stochastic Gradient Descent and Application to Data-Parallel Distributed Training of Speech DNNs", 15th Annual Conference of the International Speech Communication Association, Singapore, Sep. 14-18, 2014, pp. 1058-1062.
Shamir et al., "Communication-Efficient Distributed Optimization Using an Approximate Newton-Type Method", arXiv1312.7853v4, May 13, 2013, 22 pages.
Shamir et al., "Distributed Stochastic Optimization and Learning", Fifty-second Annual Allerton Conference on Communication, Control, and Computing, Monticello, Illinois, United States, Oct. 1-3, 2014, pp. 850-857.
Shokri et al., "Privacy-Preserving Deep Learning", Twenty-second Association for Computing Machinery SIGSAC Conference on Computer and Communications Security, Denver, Colorado, United States, Oct. 12-16, 2015, 12 pages.
Springenberg et al., "Striving for Simplicity: The All-Convolutional Net", arXiv:1412.6806v3, Apr. 13, 2015, 14 pages.
Suresh et al., "Distributed Mean Estimation with Limited Communication", arXiv.1611.00429v3, Sep. 25, 2017, 17 pages.
Tsitsiklis et al., "Communication Complexity of Convex Optimization", Journal of Complexity, vol. 3, Issue 3, Sep. 1, 1987, pp. 231-243.
Wikipedia, "Rounding", https://en.wikipedia.org/wiki/Rounding, retrieved on Aug. 14, 2017, 13 pages.
Woodruff, "Sketching as a Tool for Numerical Linear Algebra", arXiv:1411.4357v3, Feb. 10, 2015, 139 pages.
Xie et al., "Distributed Machine Learning via Sufficient Factor Broadcasting", arXiv:1409.5705v2, Sep. 7, 2015, 15 pages.
Xing et al., "Petuum: A New Platform for Distributed Machine Learning on Big Data", Conference on Knowledge Discovery and Data Mining, Aug. 10-13, 2015, Hilton, Sydney, 10 pages.
Yadan et al., "Multi-GPU Training of ConvNets", International Conference on Learning Representations, Apr. 14-16, 2014, Banff, Canada, 4 pages.
Yang, "Trading Computation for Communication: Distributed Stochastic Dual Coordinate Ascent", Advances in Neural Information Processing Systems, Lake Tahoe, Nevada, United States, Dec. 5-10, 2013, pp. 629-637.
Yu et al., "Circulant Binary Embedding", arXiv:1405.3162v1, May 13, 2014, 9 pages.
Yu et al., "Orthogonal Random Features", Neural Information Processing Systems, Barcelona, Spain, Dec. 5-10, 2016, 9 pages.
Zhang et al., "Communication-Efficient Algorithms for Statistical Optimization", arXiv.1209.4129v3, Oct. 11, 2013, 44 pages.
Zhang et al., "Communication-Efficient Distributed Optimization of Self Concordant Empirical Loss", arXiv:1501.00263v1, Jan. 1, 2015, 46 pages.
Zhang et al., "DISCO: Distributed Optimization for Self-Concordant Empirical Loss", 32nd International Conference on Machine Learning, vol. 37, 2015, pp. 362-370.
Zhang et al., "Information-Theoretic Lower Bounds for Distributed Statistical Estimation with Communication Constraints." Advances in Neural Information Processing Systems, Lake Tahoe, Nevada, United States, Dec. 5-10, 2013, pp. 2328-2336.
Zhang et al., "Poseidon: A System Architecture for Efficient GPU-based Deep Learning on Multiple Machines", arXiv:1512.06216v1, Dec. 19, 2015, 14 pages.

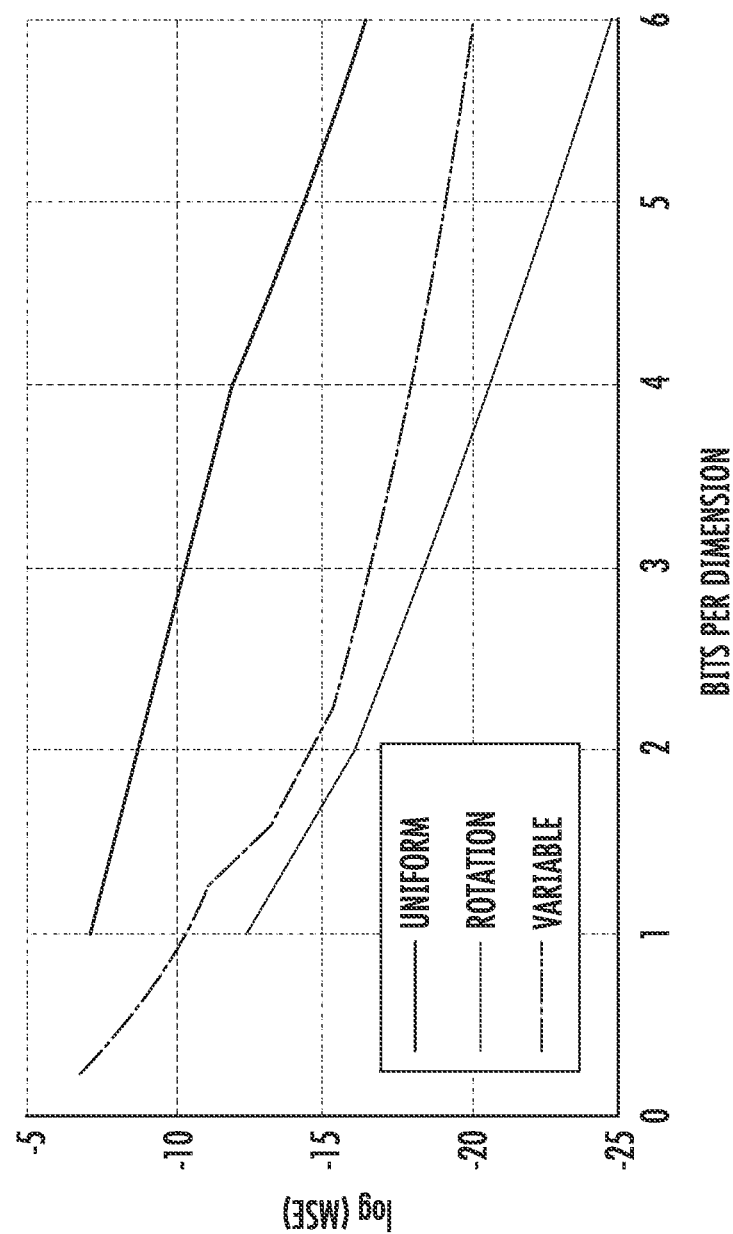

MNIST k = 16

MNIST k = 32

CIFAR k = 16

CIFAR k = 32

MNIST $k = 16$

MNIST $k = 32$

CIFAR $k = 16$

CIFAR $k = 32$

SYSTEMS AND METHODS FOR COMMUNICATION EFFICIENT DISTRIBUTED MEAN ESTIMATION

PRIORITY CLAIM

The present application is a continuation of U.S. application Ser. No. 17/502,794 having a filing date of Oct. 15, 2021, which is a continuation of U.S. application Ser. No. 15/708,793 having a filing date of Sep. 19, 2017, which is a continuation-in-part of U.S. application Ser. No. 15/676,076 having a filing date of Aug. 14, 2017, which claims priority to and the benefit of U.S. Provisional Application No. 62/400,019, filed Sep. 26, 2016. Applicant claims priority to and the benefit of each of such applications.

FIELD

The present disclosure relates generally to distributed computing. More particularly, the present disclosure relates to systems and methods for communication efficient distributed mean estimation.

BACKGROUND

Given a number of vectors that reside on a number of different clients, the goal of distributed mean estimation is to estimate the mean of such vectors. This basic estimation problem is used as a subroutine in several learning and optimization tasks where data is distributed across several clients. For example, in Lloyd's algorithm for k-means clustering, if data is distributed across several clients, the server needs to compute the means of all clusters in each update step. Similarly, for principal components analysis (PCA), if data samples are distributed across several clients, then for the power-iteration method, the server needs to average the output of all clients in each step.

Recently, algorithms involving distributed mean estimation have been used extensively in training large-scale neural networks and other statistical models. In an example scenario of synchronized distributed learning, each client obtains a copy of a global model. The clients then update the model independently based on their local data. The updates (usually in the form of gradients) are then sent to a server, where they are averaged and used to update the global model. A critical step in all of the above algorithms is to estimate the mean of a set of vectors.

However, one of the main bottlenecks in distributed algorithms is the communication cost, which can be prohibitive for modern applications. For example, communication cost can be significant in example distributed computing systems where each client can be a low-power and/or low-bandwidth device such as, for example, a mobile phone, an embedded computing device, or other connected smart devices such as intelligent speakers, cameras, home appliances, vehicle computing systems, etc.

SUMMARY

Aspects and advantages of embodiments of the present disclosure will be set forth in part in the following description, or can be learned from the description, or can be learned through practice of the embodiments.

One aspect of the present disclosure is directed to a computing system to facilitate transmission of machine-learned model updates from client devices to a centralized server computing device. The computing system includes one or more client computing devices. Each client computing device includes one or more processors and one or more non-transitory computer-readable media that store instructions that, when executed by the one or more processors cause the client computing device to perform operations. The operations include determining an update to a machine-learned model based at least in part on a local dataset stored at the client computing device. The operations include rotating the update by a random rotation matrix to obtain a rotated update. The operations include performing probabilistic quantization of the rotated update to obtain a quantized rotated update. The operations include transmitting the quantized rotated update to the centralized server computing device.

Another aspect of the present disclosure is directed to a computing system. The computing system includes one or more client computing devices. Each client computing device includes one or more processors and one or more non-transitory computer-readable media that store instructions that, when executed by the one or more processors cause the client computing device to perform operations. The operations include obtaining a vector. The operations include rotating the vector by a random rotation matrix to obtain a rotated vector. The operations include performing probabilistic quantization of the rotated vector to obtain a quantized rotated vector. The operations include transmitting the quantized rotated vector.

Another aspect of the present disclosure is directed to a computing system. The computing system includes one or more client computing devices. Each client computing device includes one or more processors and one or more non-transitory computer-readable media that store instructions that, when executed by the one or more processors cause the client computing device to perform operations. The operations include obtaining a vector. The operations include performing probabilistic quantization of the vector to obtain a quantized vector. Performing probabilistic quantization of the vector includes determining a value for each of a number of quantization levels based at least in part on a magnitude of the vector and a minimum coordinate value included in the vector. Performing probabilistic quantization of the vector includes quantizing each coordinate of the vector into one of the number of quantization levels.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 1 depicts a graphical diagram of example results of distributed mean estimation on data generated from a Gaussian distribution according to example embodiments of the present disclosure.

DETAILED DESCRIPTION

1. Introduction

Figure 2A:
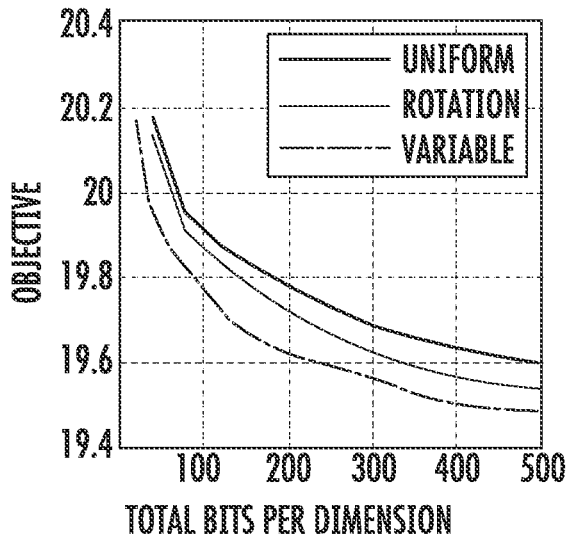
FIGS. 2A-D depict graphical diagrams of example results for performance of Lloyd's algorithm with different types of quantizations according to example embodiments of the present disclosure.
Figure 2B:
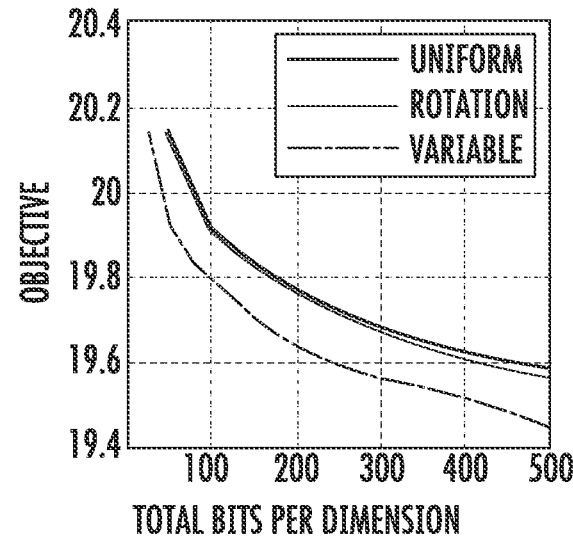
Figure 2C:
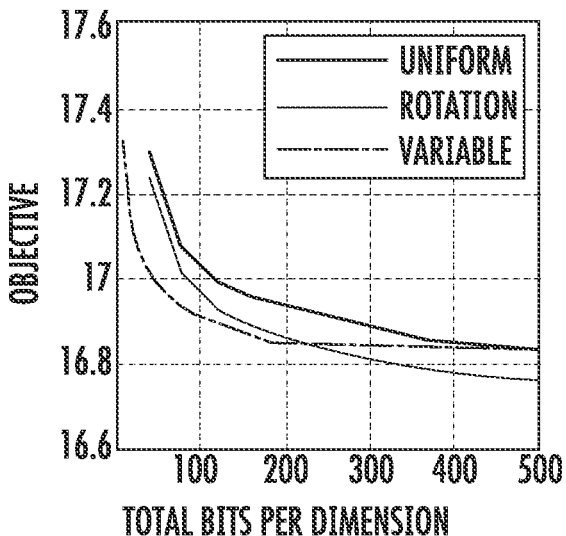
Figure 2D:
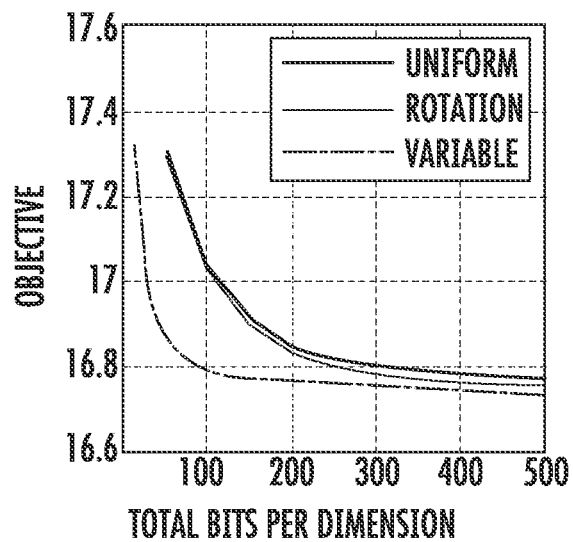
Figure 3A:
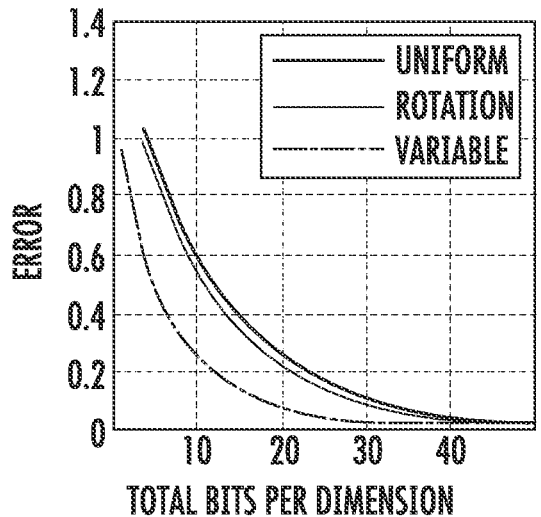
FIGS. 3A-D depict graphical diagrams of example results for performance of power iteration with different types of quantizations according to example embodiments of the present disclosure.
Figure 3B:
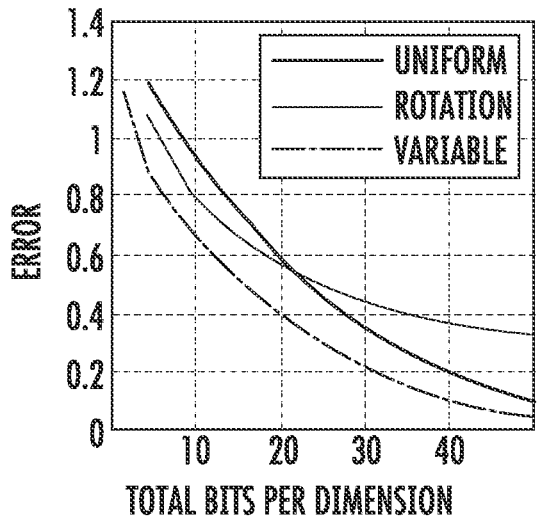
Figure 3C:
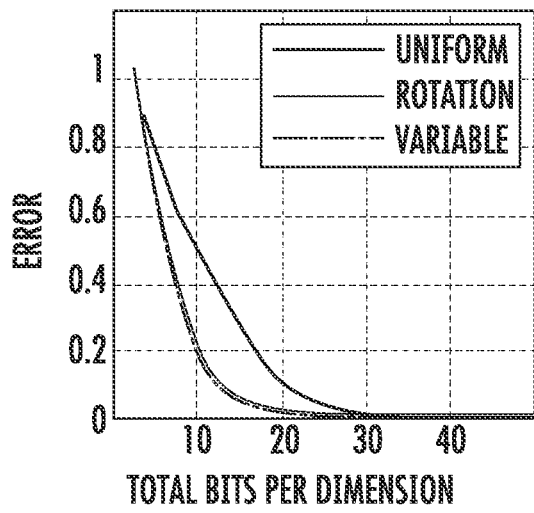
Figure 3D:
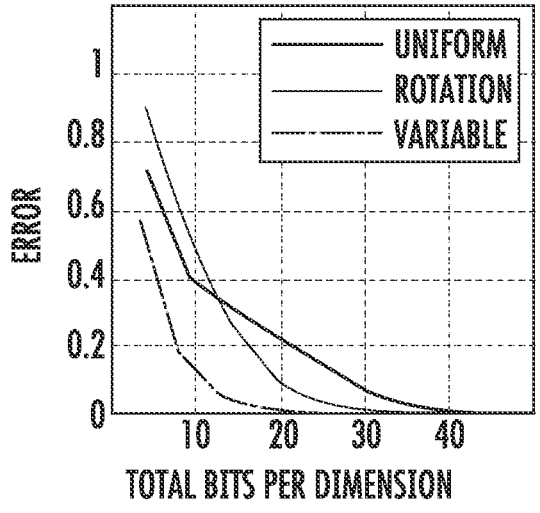

Generally, the present disclosure provides systems and methods for communication efficient distributed mean estimation. In particular, the present disclosure addresses the need for distributed learning and optimization algorithms with low communication cost. However, unlike previous works, the systems and methods of the present disclosure make no probabilistic assumptions on the data.

Aspects of the present disclosure can be implemented by a system in which a number of vectors reside on a number of different client computing devices, and each client device seeks to transmit its respective vector to a centralized server computing device to enable the server device to estimate the mean of the vectors. As one example application, the techniques of the present disclosure can enable communication efficient uploads of local machine-learned model gradients from the client devices to the server device, where the server device aggregates the received gradients to update a global machine-learned model.

One aspect of the present disclosure is directed to a random rotation technique to improve communication efficiency. In particular, a client computing device can rotate a vector by a random rotation matrix and then subsequently perform probabilistic quantization on the rotated vector. For example, the present disclosure provides a stochastic k-level quantization technique. As demonstrated by the present disclosure, performing the random rotation prior to quantization can significantly reduce the quantization error, thereby leading to improved communication efficiency.

After quantization, the client device can transmit the quantized rotated vector to a centralized server computing device. The server computing device can receive multiple vectors from multiple client computing devices. The server computing device can determine a mean of the multiple received vectors and can de-rotate the mean vector using an inverse random rotation matrix.

In such fashion, the vectors can be communicated from the clients to the server in a highly efficient manner. In particular, in some implementations, this random rotation technique can reduce the mean square error of the mean estimation significantly by a factor of $$\mathcal{O}\left(\frac{d}{\log d}\right).$$

Another aspect of the present disclosure is directed to a variable length coding technique to improve communication efficiency. In particular, subsequent to quantization but prior to transmission of the vector, the client computing device can encode the quantized vector according to a variable length coding scheme (e.g., by computing variable length codes). The server computing device can then decode the received vectors using the variable length coding scheme. This variable length coding technique can reduce the mean squared error by $\mathcal{O}$ (d) as compared to a naive approach that includes neither random rotation nor variable length coding. In fact, the present disclosure mathematically demonstrates that this variable length coding approach is communication optimal.

The systems and methods of the present disclosure provide a number of technical effects and benefits. As a first example technical effect and benefit, the present disclosure enables transmission of information (e.g., machine-learned model updates) in a more efficient and lower bandwidth manner. For example, the random rotation technique and the variable length coding technique can reduce the number of bits required to represent the information, thereby enabling faster and lower bandwidth transmission of the information. As another example technical effect and benefit, by improving the ability to transmit vectors for aggregation at a central location, the present disclosure enables distributed training techniques in which machine-learned models are trained locally on-device and then a global model is generated or updated based on a mean of the updates resulting from the local training. Thus, the present disclosure enables and enhances such distributed scheme. The distributed training scheme results in better (e.g., more accurate) global models which have improved performance due to their exposure to additional training data. Furthermore, the distributed training scheme that is enhanced by the present disclosure improves user privacy as training data can be retained on the device and is not required to be sent to a central location. As yet another example technical effect and benefit, the present disclosure also provides enhanced security or encryption of information that is transmitted to a central location. For example, through the use of private rotation matrices the transmitted information can be rotated and only entities with the inverse of the private matrix can de-rotate to extract the information.

The present disclosure is structured as follows: first, the present disclosure demonstrates that for d dimensional data with n clients, a naive stochastic rounding approach yields a mean squared error (MSE) of $\Theta(d/n)$ and uses a constant number of bits per dimension per client. Next, this naive algorithm is extended in two ways: by demonstrating that application of a structured random rotation before quantization reduces the error to $\mathcal{O}((\log d)/n)$ and application of a better coding strategy further reduces the error to $\mathcal{O}(1/n)$. The present disclosure also demonstrates that the latter coding strategy is optimal up to a constant in the minimax sense. That is, it achieves the best MSE for a given communication cost. In addition, the present disclosure demonstrates the practicality of the algorithms described herein by applying them to distributed Lloyd's algorithm for k-means and power iteration for principal component analysis (PCA).

1.1 Example Discussion of Distributed Mean Aggregation

Given n vectors $X^n \stackrel{def}{=} X_1, X_2, \ldots, X_n \in \mathbb{R}^d$ that reside on n clients, the goal of distributed mean estimation is to estimate the mean of the vectors:

$$\overline{X} \stackrel{def}{=} \frac{1}{n}\sum_{i=1}^{n} X_i. \tag{1}$$

As described above, this basic estimation problem is used in several learning and optimization tasks where data is distributed across several clients, including, for example, Lloyd's algorithm for k-means clustering (see, e.g., Lloyd, Stuart. Least squares quantization in PCM. *IEEE Transactions on Information Theory*, 28(2):129-137, 1982); principal components analysis (PCA); and the training of large-scale neural networks and other statistical models. For example, in an example scenario of synchronized distributed learning, each client obtains a copy of a global model. The clients then update the model independently based on their local data. The updates (usually in the form of gradients) are then sent to a server, where they are averaged and used to update the global model. A critical step in all of the above algorithms is to estimate the mean of a set of vectors as in Eq. (1).

More generally, however, the communication efficient systems, methods, and techniques of the present disclosure can involve or be performed in any configuration or scenario where data (e.g., in the form of vectors) resides on or is produced by one or more different client devices and is communicated to another device such as, for example, a central server device.

In particular, one of the main bottlenecks in distributed algorithms or other scenarios where data is communicated from a client device to a server device is the communication cost, which can be prohibitive for modern applications. For example, communication cost can be significant in example distributed computing systems where each client can be a low-power and/or low-bandwidth device such as, for example, a mobile phone or other mobile computing device, an embedded computing device, a worker device in a datacenter, or other connected smart devices such as intelligent speakers, cameras, home appliances, vehicle computing systems, etc.

Given such a wide set of applications, the systems and methods of the present disclosure address the basic problem of achieving the optimal minimax rate in distributed mean estimation with limited communication or other communication constraints (e.g., communication costs).

The systems, methods, models, and results of the present disclosure differ from previous works on mean estimation in a number of ways, including the following examples. As a first example, certain previous works assume that the data is generated independent and identically distributed (i.i.d.) according to some distribution. In contrast, the present disclosure does not make any distribution assumptions on data. As a second example difference, the objective in certain prior works is to estimate the mean of the underlying statistical model, while the goal in at least some implementations of the present disclosure is to estimate the empirical mean of the data.

1.2 Example Model

In at least some implementations, the communication algorithms provided herein are simultaneous and independent. That is, the clients independently send data to the server and they can transmit at the same time. In any independent communication protocol, each client transmits a function of $X_i$ (say f ($X_i$)), and a central server estimates the mean by some function of f ($X_1$), f($X_2$), ..., f($X_n$). Let $\pi$ be any such protocol and let $\mathcal{C}$ ($\pi$, $X_i$) be the expected number of transmitted bits by the i-th client during protocol it, where throughout the present disclosure, expectation is over the randomness in protocol $\pi$. The total number of bits transmitted by all clients with the protocol $\pi$ is $$C(\pi, X^n) \stackrel{def}{=} \sum_{i=1}^{n} C_i(\pi, X_i).$$

Let the estimated mean be $\overline{\hat{X}}$. For a protocol $\pi$, the MSE of the estimate is $$\varepsilon(\pi, X^n) = \mathbb{E}[\|\overline{\hat{X}} - \overline{X}\|_2^2].$$

The systems and methods of the present disclosure can be implemented with the use of private and/or public randomness. Private randomness refers to random values that are generated by each machine separately, and public randomness refers to a sequence of random values that are shared among all parties.

As one example, in the absence of public randomness, the server can communicate a random seed that can be used by clients to emulate public randomness. More particularly, in some implementations, both the client and the server can have knowledge of a synchronized random seed. The client and the server can each use the random seed (e.g., along with a pseudo-random number generator) to separately produce random values (e.g., a random rotation matrix as will be discussed further below). In one example, the seed can be 32 bits long.

The algorithms provided by the present disclosure work for any $X^n$. However, to measure the minimax performance, without loss of generality, the following is provided with reference to the scenario where each $X_i \in S^d$, the ball of radius 1 in $\mathbb{R}^d$, i.e., $X \in S_d$ iff $$\|X\|_2 \leq 1,$$

where $\|X\|_2$ denotes the $\ell_2$ norm of the vector X. For a protocol $\pi$, the worst case error for all $X^n \in S^d$ is $$\mathcal{E}(\pi, S^d) \stackrel{def}{=} \max_{X^n: X_i \in S^d \forall i} \mathcal{E}(\pi, X^n).$$

Let $\Pi(c)$ denote the set of all protocols with communication cost at most c. The minimax MSE is $$\mathcal{E}(\Pi(c), S^d) \stackrel{def}{=} \min_{\pi \in \Pi(c)} \mathcal{E}(\pi, S^d).$$

1.3 Example Results and Discussion
1.3.1 Example Algorithms

The MSE $\varepsilon(\pi, X^n)$ is first analyzed for three algorithms, when $\mathcal{C}$ ($\pi$, $X^n$)=$\Theta$(nd), i.e., each client sends a constant number of bits per dimension.

Stochastic uniform quantization. In Section 2.1, it is first shown that a naive stochastic binary quantization algorithm (denoted by $\pi_{sb}$) achieves an MSE of $$\mathcal{E}(\pi_{sb}, X^n) = \Theta\left(\frac{d}{n} \cdot \frac{1}{n}\sum_{i=1}^{n}\|X_i\|_2^2\right),$$

and $\mathcal{C}(\pi_{sb}, X^n) = n \cdot (d + \tilde{\mathcal{O}}(1))$, where $\tilde{\mathcal{O}}(1)$ is used to denote $\mathcal{O}(\log(dn))$. That is, each client sends one bit per dimension. It is further shown that this bound is tight. In many practical scenarios, d is much larger than n and the above error is prohibitive.

A natural way to decease the error is to increase the number of levels of quantization.

If k levels of quantization are used, in Theorem 2, the error deceases as $$\mathcal{E}(\pi_{sk}, X^n) = O\left(\frac{d}{n(k-1)^2} \cdot \frac{1}{n}\sum_{i=1}^{n}\|X_i\|_2^2\right). \quad (2)$$

However, the communication cost would increase to $\mathcal{C}(\pi_{sk}, X^n) = n \cdot (d\lceil \log_2 k \rceil + \tilde{\mathcal{O}}(1))$ bits, which can be expensive, if the MSE is desired to be o(d/n).

In order to reduce the communication cost, the present disclosure proposes two approaches.

Stochastic rotated quantization: The present disclosure demonstrates that preprocessing the data by a random rotation reduces the mean squared error. Specifically, in Theorem 3, it is shown that this new scheme (denoted by $\pi_{srk}$) achieves an MSE of $$\mathcal{E}(\pi_{srk}, X^n) = O\left(\frac{\log d}{n(k-1)^2} \cdot \frac{1}{n}\sum_{i=1}^{n}\|X_i\|_2^2\right),$$

and has a communication cost of $\mathcal{C}(\pi_{srk}, X^n) = n \cdot (d\lceil \log_2 k \rceil + \tilde{\mathcal{O}}(1))$. Note that all logarithms are to base e, unless stated otherwise. Also note that the new scheme achieves much smaller MSE than naive stochastic quantization for the same communication cost.

Variable length coding: A second approach provided by the present disclosure uses the same quantization as $\pi_{sk}$ but encodes levels via variable length coding. Instead of using $\lceil \log_2 k \rceil$ bits per dimension, it is shown that using variable length encoding such as arithmetic coding to compress the data reduces the communication cost significantly. In particular, in Theorem 4 it is shown that there is a scheme (denoted by $\pi_{svk}$) such that $$C(\pi_{svk}, X^n) = O\left(nd\left(1 + \log\left(\frac{k^2}{d} + 1\right)\right) + \tilde{O}(n)\right), \quad (3)$$

and $\varepsilon(\pi_{svk}, X^n) = \varepsilon(\pi_{sk}, X^n)$.

Hence, setting $k = \sqrt{d}$ in Eqs. (2) and (3) yields $$\varepsilon(\pi_{svk}, X^n) = O\left(\frac{1}{n} \cdot \frac{1}{n}\sum_{i=1}^{n}\|X_i\|_2^2\right),$$

and with $\Theta(nd)$ bits of communication i.e., constant number of bits per dimension per client. Of the three protocols, $\pi_{svk}$ has the best MSE for a given communication cost. Note that $\pi_{svk}$ uses k quantization levels but still uses $\mathcal{O}(1)$ bits per dimension per client for all $k \leq \sqrt{d}$.

Theoretically, while variable length coding has better guarantees, stochastic rotated quantization has several practical advantages: it uses fixed length coding and hence can be combined with encryption schemes for privacy preserving secure aggregation. It can also provide lower quantization error in some scenarios due to better constants (see, e.g., Section 7 for details).

1.3.2 Example Minimax MSE

In the above protocols, all of the clients transmit the data. According to an aspect of the present disclosure, these protocols can be augmented with a sampling procedure, where only a random fraction of clients transmit data. The present disclosure demonstrates that a combination of k-level quantization, variable length coding, and sampling can be used to achieve information theoretically optimal MSE for a given communication cost. In particular, combining Corollary 1 and Theorem 5 yields the following minimax result:

Theorem 1 There exists a universal constant t<1 such that for communication cost c≤ndt and n≥1/t, $$\varepsilon(\Pi(c), S^d) = \Theta\left(\min\left(1, \frac{d}{c}\right)\right).$$

This result shows that the product of communication cost and MSE scales linearly in the number of dimensions.

The remainder of the present disclosure is organized as follows. First, the stochastic uniform quantization technique is analyzed in Section 2. In Section 3, a novel stochastic rotated quantization technique is proposed, and in Section 4 arithmetic coding is analyzed. In Section 5, the above algorithms are combined with a sampling technique and the upper bound on the minimax risk is stated. In Section 6, the matching minimax lower bounds are stated. In Section 7 some practical considerations are discussed and the algorithms are applied on distributed power iteration and Lloyd's algorithm. Section 8 provides a proof of Lemma 7. Section 9 describes example computing systems that can implement the techniques described herein. Section 10 describes example methods to implement the techniques described herein and Section 11 provides some additional disclosure.

2. Example Stochastic Uniform Quantization 2.1 Example Stochastic Binary Quantization For a vector $X_i$, let $X_i^{max} = \max_{1 \leq j \leq d} X_i(j)$ and similarly let $X_i^{min} = \min_{1 \leq j \leq d} X_i(j)$. In the stochastic binary quantization protocol $\pi_{sb}$, for each client i, the quantized value for each coordinate j is generated independently with private randomness as $$Y_i(j) = \begin{cases} X_i^{max} & \text{with probability } \frac{X_i(j) - X_i^{min}}{X_i^{max} - X_i^{min}}, \\ X_i^{min} & \text{otherwise} \end{cases}$$

Observe $\mathbb{E}\, Y_1(j) = X_i(j)$. The server estimates $\overline{X}$ by $$\hat{\overline{X}}_{\pi_{sb}} = \frac{1}{n}\sum_{i=1}^{n} Y_i.$$

First, the communication cost of this protocol will be bounded as described below.

Lemma 1 There exists an implementation of stochastic binary quantization that uses $d + \tilde{\mathcal{O}}(1)$ bits per client and hence $\mathcal{C}(\pi_{sb}, X^n) \leq n \cdot (d + \tilde{\mathcal{O}}(1))$.

Proof. Instead of sending vectors $Y_i$, clients transmit two real values $X_i^{max}$ and $X_i^{min}$ (to a desired error) and a bit vector $Y'_i$ such that $Y'_i(j) = 1$ if $Y_i = X_i^{max}$ and 0 otherwise. Hence each client transmits $d + 2r$ bits, where r is the number of bits to transmit the real value to a desired error.

Let B be the maximum norm of the underlying vectors. To bound r, observe that using r bits, one can represent a number between $-B$ and $B$ to an error of $B/2^{r-1}$. Thus using $3 \log_2(dn) + 1$ bits one can represent the minimum and maximum to an additive error of $B/(nd)^3$. This error in transmitting minimum and maximum of the vector does not affect the calculations and it is ignored for simplicity. Note that in practice, each dimension of $X_i$ is often stored as a 32 bit or 64 bit float, and r should be set as either 32 or 64. In this case, using an even larger r does not further reduce the error.

End proof.

Next, the estimation error of this protocol is computed as described below.

Lemma 2 For any set of vectors $X^n$, $$\varepsilon(\pi_{sb}, X^n) = \frac{1}{n^2} \sum_{i=1}^{n} \sum_{j=1}^{d} (X_i^{max} - X_i(j))(X_i(j) - X_i^{min}).$$

Proof.

$$\varepsilon(\pi_{sb}, X^n) = \mathbb{E} \left\| \hat{\bar{X}} - \bar{X} \right\|_2^2 = \frac{1}{n^2} \mathbb{E} \left\| \sum_{i=1}^{n} (Y_i - X_i) \right\|_2^2 = \frac{1}{n^2} \sum_{i=1}^{n} \mathbb{E} \| Y_i - X_i \|_2^2,$$

where the last equality follows by observing that $Y_i - X_i$, $\forall i$ are independent zero mean random variables. The proof follows by observing that for every i, $$\mathbb{E} \| Y_i - X_i \|_2^2 = \sum_{j=1}^{d} \mathbb{E}[(Y_i(j) - X_i(j))^2] = \sum_{j=1}^{d} (X_i^{max} - X_i(j))(X_i(j) - X_i^{min}).$$

End proof.

Lemma 2 implies the following upper bound.

Lemma 3 For any set of vectors $X^n$, $$\varepsilon(\pi_{sb}, X^n) \leq \frac{d}{2n} \cdot \frac{1}{n} \sum_{i=1}^{n} \|X_i\|_2^2.$$

Proof. The proof follows by Lemma 2 observing that $\forall j$ $$(X_i^{max} - X_i(j))(X_i(j) - X_i^{min}) \leq \frac{(X_i^{max} - X_i^{min})^2}{4},$$

and $(X_i^{max} - X_i^{min})^2 \leq 2 \|X_i\|_2^2$. \quad (4)

End proof.

It can also be shown that the above bound is tight:

Lemma 4 There exists a set of vectors $X^n$ such that $$E(\pi_{sb}, X^n) \geq \frac{d-2}{2n} \cdot \frac{1}{n} \sum_{i=1}^{n} \|X_i\|_2^2.$$

Proof. For every i, let $X_i$ be defined as follows. $X_i(1) = 1/\sqrt{2}$, $X_i(2) = -1/\sqrt{2}$, and for all $j > 2$, $X_i(j) = 0$. For every i, $$X_i^{max} = \frac{1}{\sqrt{2}} \text{ and } X_i^{min} = -\frac{1}{\sqrt{2}}.$$

Substituting these bounds in the conclusion of Lemma 2 (which is an equality) yields the theorem.

End proof.

Therefore, the algorithm proposed in this subsection gives MSE $\Theta(d/n)$. Such an error is too large for real-world use. For example, in the application of neural networks, d can be on the order of millions, yet n can be much smaller than that. In such cases, the MSE is even larger than the norm of the vector.

2.2 Example Stochastic k-Level Quantization

A natural generalization of binary quantization is k-level quantization. Let k be a positive integer larger than 2. The present disclosure proposes a k-level stochastic quantization scheme $\pi_{sk}$ to quantize each coordinate. Recall that for a vector $X_i$, $X_i^{max} = \max_{1 \leq j \leq d} X_i(j)$ and $X_i^{min} = \min_{1 \leq j \leq d} X_i(j)$. For every integer r in the range $[0, k)$, let $$B_i(r) \stackrel{def}{=} X_i^{min} + \frac{rs_i}{k-1},$$

where $s_i$ satisfies $X_i^{min} + s_i \geq X_i^{max}$. A natural choice for $s_i$ would be $X_i^{max} - X_i^{min}$. However, as will be demonstrated in Section 4, a higher value of $s_i$ and variable length coding has better guarantees. The algorithm quantizes each coordinate into one of $B_i(r)$s stochastically. In $\pi_{sk}$, for the i-th client and j-th coordinate, if $X_i(j) \in [B_i(r), B_i(r+1))$, $$Y_i(j) = \begin{cases} B_i(r+1) & \text{with probability } \frac{X_i(j) - B_i(r)}{B_i(r+1) - B_i(r)} \\ B_i(r) & \text{otherwise} \end{cases}.$$

The server estimates $\bar{X}$ by $$\hat{\bar{X}}_{\pi_{sk}} = \frac{1}{n} \sum_{i=1}^{n} Y_i.$$

As before, the communication complexity of this protocol is bounded. The proof is similar to that of Lemma 1 and hence omitted.

Lemma 5 There exists an implementation of stochastic k-level quantization that uses $d \lceil \log(k) \rceil + \tilde{\mathcal{O}}(1)$ bits per client and hence $\mathcal{C}(\pi_{sk}, X^n) \leq n \cdot (d \lceil \log_2 k \rceil + \tilde{\mathcal{O}}(1))$.

The mean squared loss can be bounded as follows.

Theorem 2 If $X_i^{max} - X_i^{min} \leq s_i \leq \sqrt{2}\|X_i\|_2 \forall i$, then for any $X^n$, the $\pi_{sk}$ protocol satisfies, $$\varepsilon(\pi_{sk}, X^n) \leq \frac{d}{2n(k-1)^2} \cdot \frac{1}{n}\sum_{i=1}^{n}\|X_i\|_2^2.$$

Proof.

$$\varepsilon(\pi_{sk}, X^n) = \mathbb{E}\left\|\hat{\bar{X}} - \bar{X}\right\|_2^2 = \quad (5)$$

$$\frac{1}{n^2}\mathbb{E}\left\|\sum_{i=1}^{n}(Y_i - X_i)\right\|_2^2 = \frac{1}{n^2}\sum_{i=1}^{n}\mathbb{E}\|Y_i - X_i\|_2^2 \leq \frac{1}{n^2}\sum_{i=1}^{n}d\frac{s_i^2}{4(k-1)^2},$$

where the last equality follows by observing $Y_i(j) - X_i(j)$ is an independent zero mean random variable with $$\mathbb{E}(Y_i(j) - X_i(j))^2 \leq \frac{s_i^2}{4(k-1)^2}. \quad s_i \leq \sqrt{2}\|X_i\|_2$$

completes the proof.
End proof.

This section is concluded by noting that $s_i = X_i^{max} - X_i^{min}$ satisfies the conditions
for the above theorem by Eq. (4).

3. Example Stochastic Rotated Quantization

Next, it is shown that the algorithm of the previous section can be significantly improved by a new protocol. The motivation comes from the fact that the MSE of stochastic binary quantization and stochastic k-level quantization is $$O\left(\frac{d}{n}(X_i^{max} - X_i^{min})^2\right)$$

(the proof of Lemma 3 and Theorem 2 with $s_i = X_i^{max} - X_i^{min}$). Therefore the MSE is smaller when $X_i^{max}$ and $X_i^{max}$ are close. For example, when $X_i$ is generated uniformly on the unit sphere, with high probability, $X_i^{max} - X_i^{min}$ is $$O\left(\sqrt{\frac{\log d}{d}}\right).$$

See, e.g., Dasgupta, Sanjoy and Gupta, Anupam. An elementary proof of a theorem of Johnson and Lindenstrauss. *Random Structures & Algorithms*, 22(1):60-65, 2003. In such case, $\varepsilon(\pi_{sk}, X^n)$ is $$O\left(\frac{\log d}{n}\right)$$

instead of $$O\left(\frac{d}{n}\right).$$

In this section, it is shown that even without any assumptions on the distribution of the data, $X_i^{max} - X_i^{min}$ can be "reduced" with a structured random rotation, yielding an $$O\left(\frac{\log d}{n}\right)$$

error. This method can be denominated as stochastic rotated quantization and is denoted herein by $\pi_{srk}$.

In some implementations of the stochastic rotated quantization technique, using public randomness, all clients and the central server generate a random rotation matrix (random orthogonal matrix) $R \in \mathbb{R}^{d \times d}$ according to some known distribution. Let $Z_i = RX_i$ and $\bar{Z} = R\bar{X}$. In the stochastic rotated quantization protocol $\pi_{srk}(R)$, clients quantize the vectors $Z_i$ instead of $X_i$ and transmit them similar to $\pi_{srk}$. The server estimates $\bar{X}$ by $$\hat{\bar{X}}_{\pi_{srk}} = R^{-1}\hat{\bar{Z}}, \hat{\bar{Z}} = \frac{1}{n}\sum_{i=1}^{n}Y_i.$$

The communication cost is same as $\pi_{sk}$ and is given by Lemma 5. Next the MSE is bounded.

Lemma 6 For any $X^n$, $\varepsilon(\pi_{srk}(R), X^n)$ is at most $$\frac{d}{2n^2(k-1)^2}\sum_{i=1}^{n}\mathbb{E}_R\left[(Z_i^{max})^2 + (Z_i^{min})^2\right],$$

where $Z_i = RX_i$ and for every i, let $s_i = Z_i^{max} - Z_i^{min}$
Proof.

$$\varepsilon(\pi_{srk}, X^n) = \mathbb{E}_\pi\left\|\hat{\bar{X}} - \bar{X}\right\|^2 = \mathbb{E}_\pi\left\|R^{-1}\hat{\bar{Z}} - R^{-1}\bar{Z}\right\|^2 \stackrel{(a)}{=}$$

$$\mathbb{E}_\pi\left\|\hat{\bar{Z}} - \bar{Z}\right\|^2 \stackrel{(b)}{=} \mathbb{E}_R\mathbb{E}_\pi\left[\left\|\hat{\bar{Z}} - \bar{Z}\right\|^2 \mid Z_1^n\right] \leq \frac{d}{4n^2(k-1)^2}\sum_{i=1}^{n}\mathbb{E}_R[(Z_i^{max} - Z_i^{min})^2],$$

where the last inequality follows Eq. (5) and the value of $s_i$. (a) follows from the fact that rotation does not change the norm of the vector, and (b) follows from the tower law of expectation. The lemma follows from observing that $(Z_i^{max} - Z_i^{min})^2 \leq 2(Z_i^{max})^2 + 2(Z_i^{min})^2.$ End proof.

To obtain strong bounds, an orthogonal matrix R that achieves low $(Z_i^{max})^2$ and $(Z_i^{min})^2$ is beneficial. In addition, due to the fact that d can be huge in practice, a type of orthogonal matrix that permits fast matrix-vector products is also beneficial. Naive orthogonal matrices that support fast multiplication such as block-diagonal matrices often result in high values of $(Z_i^{max})^2$ and $(Z_i^{min})^2$. As such, the present disclosure provides a special type of orthogonal matrix R=HD, where D is a random diagonal matrix with i.i.d. Rademacher entries (±1 with probability 0.5). H is a Walsh-Hadamard matrix. See Horadam, Kathy J. *Hadamard matrices and their applications*. Princeton university press, 2012.

The Walsh-Hadamard matrix of dimension $2^m$ for $m \in \mathcal{N}$ is given by the recursive formula, $$H(2^1) = \begin{bmatrix} 1 & 1 \\ 1 & -1 \end{bmatrix}, H(2^m) = \begin{bmatrix} H(2^{m-1}) & H(2^{m-1}) \\ H(2^{m-1}) & -H(2^{m-1}) \end{bmatrix}.$$

Both applying the rotation and inverse rotation take $\mathcal{O}(d \log d)$ time and $\mathcal{O}(1)$ additional space (with an in-place algorithm). The next lemma bounds $\mathbb{E}(Z_i^{max})^2$ and $\mathbb{E}(Z_i^{min})^2$ for this choice of R. The lemma is similar to that of Ailon, Nir and Chazelle, Bernard. Approximate nearest neighbors and the fast Johnson-Lindenstrauss transform. STOC, 2006. The proof is provided in Section 8 for completeness.

Lemma 7 Let R=HD, where D is a diagonal matrix with independent Radamacher random variables. For every i and every sequence $X^n$, $$\mathbb{E}[(Z_i^{min})^2] = \mathbb{E}[(Z_i^{max})^2] \leq \frac{\|X_i\|_2^2 (2 \log d + 2)}{d}.$$

Combining the above two lemmas yields a significant result.

Theorem 3 For any $X^n$, $\pi_{srk}(HD)$ protocol satisfies, $$\mathcal{E}(\pi_{srk}(HD), X^n) \leq \frac{2 \log d + 2}{n(k-1)^2} \cdot \frac{1}{n} \sum_{i=1}^{n} \|X_i\|_2^2.$$

4. Example Variable Length Coding

Instead of preprocessing the data via a rotation matrix as in $\pi_{srk}$, in this section the present disclosure provides use of a variable length coding strategy to minimize the number of bits.

Consider the stochastic k-level quantization technique. A natural way of transmitting $Y_i$ is sending the bin number for each coordinate, thus the total number of bits the algorithm sends per transmitted coordinate would be $d\lceil \log_2 k \rceil$. This naive implementation is sub-optimal. Instead, The present disclosure proposes to, in some implementations, further encode the transmitted values using universal compression schemes. See, e.g., Krichevsky, R and Trofimov, V. The performance of universal encoding. *IEEE Transactions on Information Theory*, 27(2):199-207, 1981; and Falahatgar, Moein and Jafarpour, Ashkan and Orlitsky, Alon and Pichapati, Venkatadheeraj and Suresh, Ananda Theertha. Universal compression of power-law distributions. ISIT, 2015.

As one example technique that can be performed: encode $h_r$, the number of times each quantized value r has appeared, and then use a variable length coding scheme (e.g., arithmetic or Huffman coding) corresponding to the distribution $$p_r = \frac{h_r}{d}.$$

This Tecnnique is denoted herein by $\pi_{svk}$. Since the vectors are quantized the same way in $\pi_{sk}$ and $\pi_{svk}$, the MSE of $\pi_{svk}$ is also given by Theorem 2. The communication cost is now bounded.

Theorem 4 Let $s_i = \sqrt{2}\|X_i\|$. There exists an implementation of $\pi_{svk}$ such that $\mathcal{C}(\pi_{svk}, X^n)$ is at most $$n\left(d\left(2 + \log_2\left(\frac{(k-1)^2}{2d} + \frac{5}{4}\right)\right) + k \log_2 \frac{(d+k)e}{k} + \tilde{\mathcal{O}}(1)\right).$$

Proof. As in Lemma 1, $\tilde{\mathcal{O}}(1)$ bits are used to transmit the $s_i$'s and $X_i^{min}$. Recall that $h_r$ is the number of coordinates that are quantized into bin r, and r takes k possible values. Furthermore, $\Sigma_r h_r = d$. Thus the number of bits necessary to represent the $h_r$'s is $$\left\lceil \log_2 \binom{d+k-1}{k-1} \right\rceil \leq k \log_2 \frac{(d+k)e}{k}.$$

Once the $h_r$'s have been compressed, variable length coding, such as, for example, arithmetic coding, corresponding to the distribution $p_r = h_r/d$ can be used to compress and transmit bin values for each coordinate. The total number of bits arithmetic coding uses is $$d \sum_{r=0}^{k-1} \frac{h_r}{d} \log_2 \frac{d}{h_r} + 2.$$

See, MacKay, David J C. *Information theory, inference and learning algorithms*. Cambridge university press, 2003.

Let $p_r = h_r/d$, $a = (k-1)X_i^{min}$, $b = s_i$, and $\beta = \Sigma_{r=0}^{k-1} 1/((a+br)^2 + \delta)$. Note that $$\sum_r p_r \log_2 \frac{1}{p_r} =$$

$$\sum_r p_r \log_2 \frac{1/(((a+br)^2 + \delta)\beta)}{p_r} + \sum_r p_r \log_2(((a+br)^2 + \delta)\beta) \leq$$

$$\sum_r p_r \log_2(((a+br)^2 + \delta)\beta) \leq \log_2\left(\sum_r p_r(a+br)^2 + \delta\right) + \log_2 \beta,$$

where the first inequality follows from the positivity of KL-divergence. Choosing $\delta = s_i^2$, yields $\beta \leq 4/s_i^2$ and hence, $$\sum_r p_r \log_2 \frac{1}{p_r} \leq \log_2\left(\sum_r p_r(a+br)^2 + s_i^2\right) + \log_2(4/s_i^2).$$

Note that if $Y_i(j)$ belongs to bin r, $(a+br)^2 = (k-1)^2 Y_i^2(j)$. Recall that $h_r$ is the number of coordinates quantized into bin r. Hence $\Sigma_r h_r(a+br)^2$ is the scaled norm-square of $Y_i$, i.e., $$\sum_r h_r(a+br)^2 = (k-1)^2 \sum_{j=1}^{d} Y_i^2(j)$$

$$= \sum_{j=1}^{d} ((X_i(j) + \alpha(j))(k-1))^2,$$

where the $\alpha(j) = Y_i(j) - X_i(j)$. Taking expectations on both sides and using the fact that the $\alpha(j)$ are independent zero mean random variables over a range of $s_i/(k-1)$, provides $$\mathbb{E}\sum_r h_r(a+br)^2 = \sum_{j=1}^d \mathbb{E}(X_i(j)^2 + \alpha(j)^2)(k-1)^2$$

$$\leq \|X_i\|_2^2\left((k-1)^2 + \frac{d}{2}\right) \quad 5$$

Using Jensen's inequality yields the result.
End proof.
Thus if $k=\sqrt{d}+1$, the communication complexity is $\mathcal{O}(nd)$ and the MSE is $\mathcal{O}(1/n)$.

5. Example Communication MSE Trade-off

In the above protocols, all the clients transmit and hence the communication cost scales linearly with n. However, the present disclosure demonstrates that any of the above protocols can be combined by client sampling to obtain trade-offs between the MSE and the communication cost. Note that similar analysis also holds for sampling the coordinates.

Let $\pi$ be a protocol where the mean estimate is of the form:

$$\hat{\overline{X}} = R^{-1}\frac{1}{n}\sum_{i=1}^n Y_i. \quad (6)$$

All three protocols that have been discussed are of this form. Let $\pi_p$ be the protocol where each client participates independently with probability p. The server estimates $\overline{X}$ by $$\hat{\overline{X}}_{\pi_p} = R^{-1} \cdot \frac{1}{np}\sum_{i\in S} Y_i,$$

where $Y_i$s are defined in the previous section and S is the set of clients that transmitted.

Lemma 8 For any set of vectors $X^n$ and protocol $\pi$ of the form Equation (6), its sampled version $\pi_p$ satisfies $$\mathcal{E}(\pi_p, X^n) = \frac{1}{p}\cdot\mathcal{E}(\pi, X^n) + \frac{1-p}{np}\sum_{i=1}^n \|X_i\|_2^2.$$

and $$C(\pi_p, X^n) = p\cdot C(\pi, X^n).$$

Proof. The proof of communication cost follows from Lemma 5 and the fact that in expectation, np clients transmit. The MSE is now bounded. Let S be the set of clients that transmit. The error $\mathcal{E}(\pi_p, X^n)$ is $$\mathbb{E}\left[\left\|\hat{\overline{X}} - \overline{X}\right\|_2^2\right] = \mathbb{E}\left[\left\|\frac{1}{np}\sum_{i\in S}R^{-1}Y_i - \overline{X}\right\|_2^2\right]$$

$$= \mathbb{E}\left[\left\|\frac{1}{np}\sum_{i\in S}X_i - \overline{X}\right\|_2^2 + \frac{1}{n^2p^2}\left\|\sum_{i\in S}(R^{-1}Y_i - X_i)\right\|_2^2\right],$$

where the last equality follows by observing that $R^{-1}Y_i - X_i$ are independent zero mean random variables and hence for any i, $\mathbb{E}[(R^{-1}Y_i - X_i)^T(\Sigma_{i\in S}X_i - \overline{X})] = 0$. The first term can be bounded as $$\mathbb{E}\left\|\frac{1}{np}\sum_{i\in S}X_i - \overline{X}\right\|_2^2 = \frac{1}{n^2}\sum_{i=1}^n\mathbb{E}\left\|\frac{1}{p}X_i 1_{i\in S} - X_i\right\|_2^2$$

$$= \frac{1}{n^2}\sum_{i=1}^n\left(p\frac{(1-p)^2}{p^2}\|X_i\|_2^2 + (1-p)\|X_i\|_2^2\right).$$

$$= \frac{1-p}{np}\cdot\frac{1}{n}\sum_{i=1}^n\|X_i\|_2^2$$

Furthermore, the second term can be bounded as $$\mathbb{E}\left[\frac{1}{n^2p^2}\left\|\sum_{i\in S}(R^{-1}Y_i - X_i)\right\|_2^2\right] \stackrel{(a)}{=} \frac{1}{n^2p^2}\sum_{i\in S}\mathbb{E}\left[\left\|(R^{-1}Y_i - X_i)\right\|_2^2\right]$$

$$= \frac{1}{n^2p^2}\sum_{i=1}^n\mathbb{E}\left[\left\|(R^{-1}Y_i - X_i)\right\|_2^2 1_{i\in S}\right]$$

$$= \frac{1}{n^2p}\sum_{i=1}^n\mathbb{E}\left[\left\|R^{-1}Y_i - X_i\right\|_2^2\right]$$

$$= \frac{1}{n^2p}\mathbb{E}\left[\left\|\sum_{i=1}^n(R^{-1}Y_i - X_i)\right\|_2^2\right] = \frac{1}{p}\mathcal{E}(\pi, X^n)$$

where the last equality follows from the assumption that $\pi$'s mean estimate is of the form (6). ($\alpha$) follows from the fact that $R^{-1}Y_i - X_i$ are independent zero mean random variables.
End proof.

Combining the above lemma with Theorem 4, and choosing $k=\sqrt{d}+1$ results in the following.

Corollary 1 For every $c \leq nd(2+\log_2(7/4))$, there exists a protocol $\pi$ such that $C(\pi, S^d) \leq c$ and $$\mathcal{E}(\pi, S^d) = O\left(\min\left(1, \frac{d}{c}\right)\right).$$

6. Example Lower Bounds

The lower bound relies on the lower bounds on distributed statistical estimation due to Zhang, Yuchen, Duchi, John, Jordan, Michael I, and Wainwright, Martin J. Information-theoretic lower bounds for distributed statistical estimation with communication constraints. NIPS, 2013.

Lemma 9 (Zhang et al., 2013 Proposition 2) There exists a set of distributions $\mathcal{P}_d$ supported on $$\left[-\frac{1}{\sqrt{d}}, \frac{1}{\sqrt{d}}\right]^d$$

such that if any centralized server wishes to estimate the mean of the underlying unknown distribution, then for any independent protocol $\pi$ $$\max_{p_d \in \mathcal{P}_d}\mathbb{E}\left[\|\theta(p_d) - \hat{\theta}_\pi\|_2^2\right] \geq t\min\left(1, \frac{d}{C(\pi)}\right),$$

where $C(\pi)$ is the communication cost of the protocol, $\theta(p_d)$ is the mean of $p_d$, and t is a positive constant.

Theorem 5 Let t be the constant in Lemma 9. For every c≤ndt/4 and n≥4/t, $$\varepsilon\left(\prod(c), S^d\right) \geq \frac{t}{4}\min\left(1, \frac{d}{c}\right).$$

Proof. Given n samples from the underlying distribution where each sample belongs to $S^d$, it is easy to see that $$\mathbb{E}\|\theta(p_d) - \hat{\theta}(p_d)\|_2^2 \leq \frac{1}{n},$$

where $\hat{\theta}(p_d)$ is the empirical mean of the observed samples. Let $\mathcal{P}_d$ be the set of distributions in Lemma 9. Hence for any protocol π there exists a distribution $p_d$ such that $$\mathbb{E}\|\hat{\theta}(p_d) - \theta_\pi\|_2^2 \overset{(a)}{\geq} \frac{1}{2}\mathbb{E}\|\theta(p_d) - \theta_\pi\|_2^2 - \mathbb{E}\|\theta(p_d) - \hat{\theta}(p_d)\|_2^2 \overset{(b)}{\geq}$$

$$\frac{t}{2}\min\left(1, \frac{d}{C(\pi)}\right) - \frac{1}{n} \overset{(c)}{\geq} \frac{t}{4}\min\left(1, \frac{d}{C(\pi)}\right),$$

Inequality (a) follows from the fact that $2(a-b)^2 + 2(b-c)^2 \geq (a-c)^2$. Inequality (b) follows from Lemma 9 and (c) follows from the fact that $C(\pi, D^d) \leq ndt/4$ and
End proof.

Corollary 1 and Theorem 5 yield Theorem 1. Note that the above lower bound holds only for communication cost $c < \mathcal{O}(nd)$.

7. Example Practical Considerations and Applications

Based on the theoretical analysis, the variable-length coding method provides the lowest quantization error asymptotically when using a constant number of bits. However in practice, stochastic rotated quantization may be preferred due to (hidden) constant factors and the fact that it uses a fixed amount of bits per dimension. For example, considering quantizing the vector [−1,1,0,0], stochastic rotated quantization can use 1 bit per dimension and gives zero error, whereas the other two protocols do not. To see this, observe that the naive quantization will quantize 0 to either 1 or −1 and variable length coding cannot achieve 0 error with 1 bit per dimension due to its constant factors.

In addition, note that the rotated quantization is preferred when applied on "unbalanced" data, due to the fact that the rotation can correct the unbalancedness. This is demonstrated by generating a dataset where the value of the last feature dimension entry is much larger than others. As an example of such dataset, 1000 datapoints were generated each with 256 dimensions. The first 255 dimensions are generated i.i.d. from N(0,1), and the last dimension is generated from N(100,1). As shown in FIG. 1, the rotated stochastic quantization has the best performance on this example dataset. The improvement is especially significant for low bit rate cases. In particular, FIG. 1 illustrates distributed mean estimation on data generated from a Gaussian distribution.

Two example applications are demonstrated in the rest of this section. The experiments are performed on the MNIST (d=2304) and CIFAR (d=512) datasets.

Distributed Lloyd's algorithm. In the distributed Lloyd's (k-means) algorithm, each client has access to a subset of data points. In each iteration, the server broadcasts the cluster centers to all the clients. Each client updates the centers based on its local data, and sends the centers back to the server. The server then updates the centers by computing the weighted average of the centers sent from all clients. In the quantized setting proposed by the present disclosure, the client compresses the new centers before sending to the server. This saves the uplink communication cost, which is often the bottleneck of distributed learning. Furthermore, in this setting, the downlink is a broadcast, and therefore its cost can be reduced by a factor of O(n/log n) without quantization, where n is the number of clients.

FIGS. 2A-D show example results in which both the number of centers and the number of clients are set to 10. In particular, FIGS. 2A-D illustrate Lloyd's algorithm with different types of quantizations. Two settings are illustrated as tested: 16 quantization levels and 32 quantizations levels. The x-axis is the average number of bits sent for each data dimensions, and the y-axis is the global objective of Lloyd's algorithm.

Distributed power iteration. Power iteration is a widely used method to compute the top eigenvector of a matrix. In the distributed setting, each client has access to a subset of data. In each iteration, the server broadcasts the current estimate of the eigenvector to all clients. Each client then updates the eigenvector based on one power iteration on its local data, and sends the updated eigenvector back to the server. The server updates the eigenvector by computing the weighted average of the eigenvectors sent by all clients.

As one example of power iteration, given a set of vectors $A_1, A_2, \ldots A_m$, at each round t, compute:

$$v_{t+1} = \frac{1}{m}\sum_{i=1}^{m} A_i A_i^T v_t$$

Data points $A_1, A_2, \ldots A_m$ are distributed across n clients. At each round of power iteration t, a client sends:

$$\sum_{j \in Client_i} A_j A_j^T v_t$$

The server can average the received information to compute $v_{t+1}$.

Similar to the above distributed Lloyd's algorithm, in the quantized setting proposed by the present disclosure, the client compresses the estimated eigenvector before sending to the server. FIGS. 3A-D show the results. The dataset is distributed over 100 clients.

In particular, FIGS. 3A-D illustrate power iteration with different types of quantizations. Two settings were tested: 16 quantization levels and 32 quantization levels. The x-axis is the average number of bits sent for each data dimension and they y-axis is the $\ell_2$ distance between the computed eigenvector and the ground-truth vector.

For both distributed Lloyd's and distributed power iteration applications, variable-length coding achieves the lowest quantization error in most of the settings. Furthermore, for low-bit rate, stochastic rotated quantization is competitive with variable-length coding.

8. Proof of Lemma 7

The equality follows from the symmetry in HD. To prove the upper bound, observe that:

$$\mathbb{E}[(Z_i^{max})^2] = \text{Var}(Z_i^{max}) + (\mathbb{E}[Z_i^{max}])^2.$$

Let $D(j)$ be the $j^{th}$ diagonal entry of D. To bound the first term observe that $Z_i^{max}$ is a function of d independent random variables $D(1), D(2), \ldots D(d)$. Changing $D(j)$ changes the $Z_i^{max}$ by at most $$\frac{2X_i(j)}{\sqrt{d}}.$$

Hence, applying Efron-Stein variance bound yields $$\text{Var}(Z_i^{max}) \leq \sum_{j=1}^{d} \frac{4X_i^2(j)}{2d} = \frac{2\|X_i\|_2^2}{d}.$$

To bound the second term, observe that for every $\beta > 0$, $$\beta Z_i^{max} = \log\exp(\beta Z_i^{max}) \leq \log\left(\sum_{j=1}^{d} e^{\beta Z_i(j)}\right).$$

Note that $$Z_i(k) = \frac{1}{\sqrt{d}} \sum_{j=1}^{d} D(j) H(k,j) X_i(j).$$

Since the $D(j)$'s are Radamacher random variables and $|H(k,j)|=1$ for all $k,j$, the distributions of $Z_i(k)$ is same for all k. Hence by Jensen's inequality, $$\mathbb{E}[Z_i^{max}] \leq \frac{1}{\beta}\mathbb{E}\left[\log\left(\sum_{j=1}^{d} e^{\beta Z_i(j)}\right)\right] \leq \frac{1}{\beta}\log\left(\sum_{j=1}^{d} \mathbb{E}[e^{\beta Z_i(j)}]\right) = \frac{1}{\beta}\log(d\mathbb{E}[e^{\beta Z_i(1)}]).$$

Since $$Z_i(1) = \frac{1}{\sqrt{d}} \sum_{j=1}^{d} D(j) X_i(j),$$

$$\mathbb{E}[e^{\beta Z_i(1)}] = \mathbb{E}\left[e^{\frac{\beta \sum_j D(j) X_i(j)}{\sqrt{d}}}\right] \stackrel{(a)}{=} \prod_{j=1}^{d} \mathbb{E}\left[e^{\frac{\beta D(j) X_i(j)}{\sqrt{d}}}\right] =$$

$$\prod_{j=1}^{d} \frac{e^{-\beta X_i(j)/\sqrt{d}} + e^{\beta X_i(j)/\sqrt{d}}}{2} \stackrel{(b)}{\leq} \prod_{i=1}^{d} e^{\beta^2 X^2(j)/2d} = e^{\beta^2 \|X_i\|_2^2/2d},$$

where (a) follows from the fact that the $D(i)$'s are independent and (b) follows from the fact that $e^a + e^{-a} \leq 2e^{a^2/2}$ for any a. Hence, $$\mathbb{E}[Z_i^{max}] \leq \min_{\beta \geq 0} \frac{\log d}{\beta} + \frac{\beta \|X_i\|_2^2}{2d} \leq \frac{2\|X_i\|_2 \sqrt{\log d}}{\sqrt{2d}}.$$

9. Example Computing Systems

Figure 4:
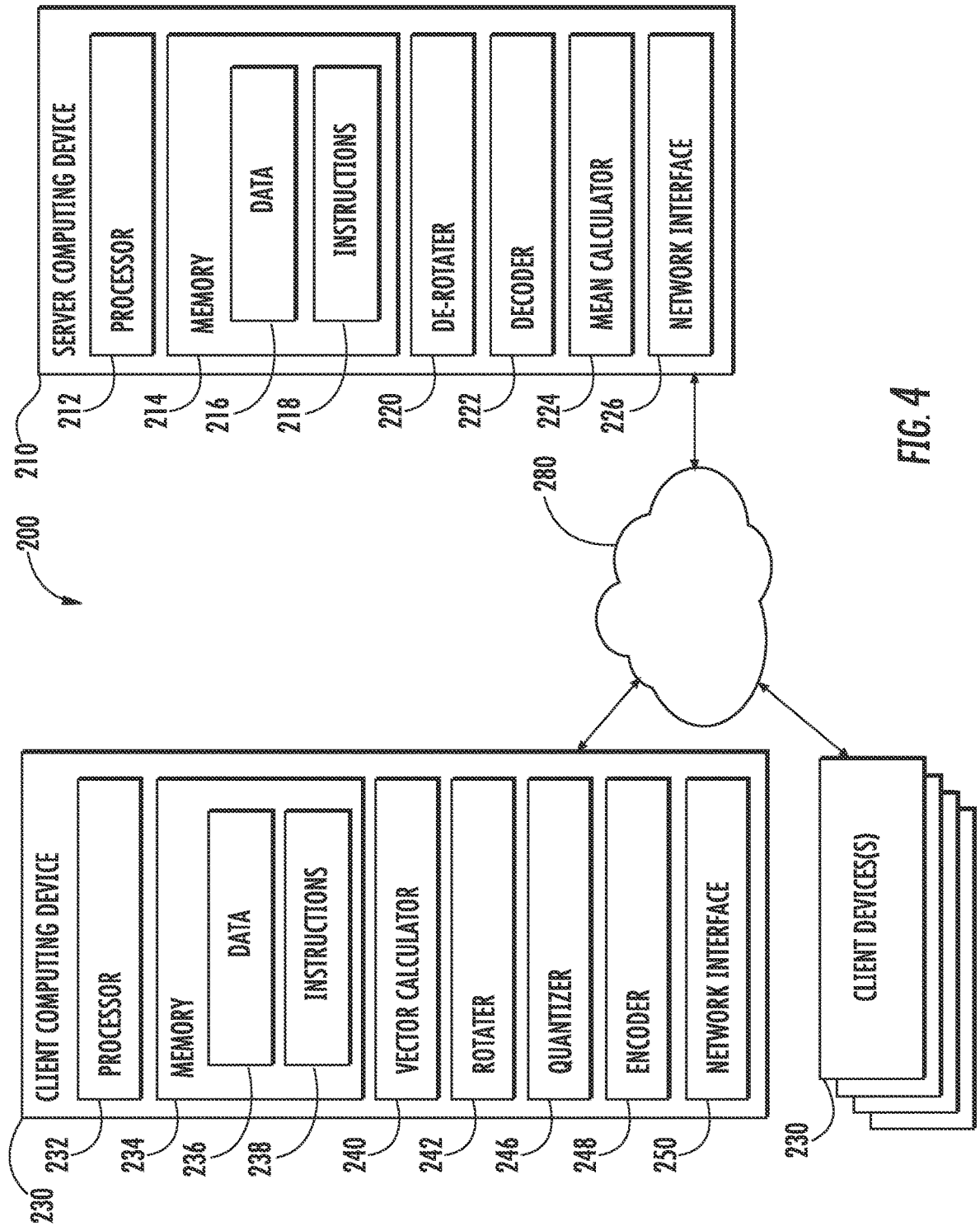
FIG. 4 depicts a block diagram of an example computing system according to example embodiments of the present disclosure.

FIG. 4 depicts an example system 200 for distributed computing. System 200 can include a server computing device 210 and a plurality of client computing devices 230.

In some implementations, and as one example application, the server computing device 210 can be configured to access a global machine-learned model and to provide the global model to the plurality of client devices 230. The model can be, for instance, a linear regression model, logistic regression model, a support vector machine model, a neural network (e.g. convolutional neural network, recurrent neural network, etc.), or other machine-learned model. In some implementations, the sever 210 can be configured to communicate with client devices 230 over one or more networks 280.

Client devices 230 can each be configured to determine one or more local updates associated with the model based at least in part on locally stored data 236. The locally stored data 236 can include audio files, image files, video files, log entries, and/or various other suitable data. In some implementations, the data 236 can be any data derived through a user interaction with a client device 230. Thus, the data 236 across the plurality of devices 230 includes data that is respectively stored at each device 230. Thus, in some implementations, the collective data 236 across all devices 230 is highly unbalanced and not independent and identically distributed.

Client devices 230 can be configured to provide the local updates to the server 210. The data 236 may be privacy sensitive. In this manner, the local updates can be performed and provided to server 210 without compromising the privacy of data 236. For instance, in such implementations, data 236 is not itself provided to server 210 since the local update does not include the actual data 236. In some implementations, one or more of encryption techniques, random noise techniques, and/or other security techniques can be added to the training process to obscure any inferable information from the local updates.

As indicated above, server 210 can receive each local update from client device 230, and can aggregate the local updates to determine a global update to the machine-learned model. In some implementations, server 210 can determine a weighted average or other mean of the local updates and determine the global update based at least in part on the average.

In some implementations, scaling or other techniques can be applied to the local updates to determine the global update. For instance, a local step size can be applied for each client device 230, the aggregation can be performed proportionally to various data partition sizes of client devices 230, and/or one or more scaling factors can be applied to the local and/or aggregated updates. It will be appreciated that various other techniques can be applied without deviating from the scope of the present disclosure.

More generally, FIG. 4 depicts an example computing system 200 that can be used to implement the methods and systems of the present disclosure. The system 200 can be implemented using a client-server architecture that includes a server 210 that communicates with one or more client devices 230 over a network 280.

The system 200 includes a server 210, such as a web server. The server 210 can be implemented using any suitable computing device(s). The server 210 can have one or more processors 212 and one or more memory devices 214. The server 210 can be implemented using one server device or a plurality of server devices. In implementations in which a plurality of devices are used, such plurality of devices can operate according to a parallel computing architecture, a sequential computing architecture, or a combination thereof.

The server 210 can also include a network interface 236 used to communicate with the client devices 230 over the network 280. The network interface can include any suitable components for interfacing with one more networks, including for example, transmitters, receivers, ports, controllers, antennas, or other suitable components.

The one or more processors 212 can include any suitable processing device, such as a microprocessor, microcontroller, integrated circuit, logic device, or other suitable processing device. The one or more memory devices 214 can include one or more computer-readable media, including, but not limited to, non-transitory computer-readable media, RAM, ROM, hard drives, flash drives, or other memory devices. The one or more memory devices 214 can store information accessible by the one or more processors 212, including computer-readable instructions 218 that can be executed by the one or more processors 212.

The instructions 218 can be any set of instructions that when executed by the one or more processors 212, cause the one or more processors 212 to perform operations.

The server 210 can further include a de-rotator 220. The de-rotator 220 can de-rotate a vector that has been rotated by a client device 230. For example, the de-rotater can use an inverse random rotation matrix that is an inverse of a random rotation matrix used by the client device 230 to rotate the vector. Alternatively, a mean of several rotated vectors can be determined prior to de-rotation and the de-rotator can de-rotated the determined mean. In some implementations, the de-rotator 220 can determine one or more inverse random rotation matrices based at least in part on one or more seeds that are shared (e.g., respectively shared or universally shared) with the client devices 230.

The server 210 can further include a decoder 222. The decoder 222 can decode a vector that has been encoded by a client device 230 (e.g., according to one of the encoding techniques discussed above). For example, the decoder can decode a vector that has been encoded according to variable length coding techniques such as, for example, Huffman coding or arithmetic coding.

The server 210 can further include a mean calculator 224. The mean calculator 224 can be configured to receive a plurality of vectors (e.g., decoded vectors, rotated vectors, and/or de-rotated vectors) and to determine a mean of the vectors (e.g., a mean vector). In some implementations in which the mean is determined prior to de-rotation, the mean vector can subsequently be de-rotated by the de-rotator 220.

As shown in FIG. 4, the one or more memory devices 214 can also store data 216 that can be retrieved, manipulated, created, or stored by the one or more processors 212. The data 216 can include, for instance, local updates, global parameters, and other data. The data 216 can be stored in one or more databases. The one or more databases can be connected to the server 210 by a high bandwidth LAN or WAN, or can also be connected to server 210 through network 280. The one or more databases can be split up so that they are located in multiple locales.

The server 210 can exchange data with client devices 230 over the network 280. Any number of client devices 230 can be connected to the server 210 over the network 280. Each of the client devices 230 can be any suitable type of computing device, such as a general purpose computer, special purpose computer, laptop, desktop, mobile device, navigation system, intelligent speaker or home assistant, home appliance, smartphone, tablet, computing device that is able to be worn, gaming console, worker device in a datacenter, a display with one or more processors, or other suitable computing device.

Similar to the server 210, a client device 230 can include one or more processor(s) 232 and a memory 234. The one or more processor(s) 232 can include, for example, one or more central processing units (CPUs), graphics processing units (GPUs) dedicated to efficiently rendering images or performing other specialized calculations, Tensor processing units (TPUs), and/or other processing devices. The memory 234 can include one or more computer-readable media and can store information accessible by the one or more processors 232, including instructions 238 that can be executed by the one or more processors 232 and data 236.

The client computing device 230 can include a vector calculator 240 that is implementable to determine one or more vectors (e.g., local updates) according to example aspects of the present disclosure. For example, in some example applications, the vector calculator 240 can perform one or more training techniques such as, for example, backwards propagation of errors to re-train or otherwise update a machine-learned model based on the locally stored data 236, thereby generating an update vector (e.g., a gradient). The vector calculator 240 can be included in an application or can be included in the operating system of the device 230. In other implementations, the vector calculator 240 can be any component or system that determines a vector to be transmitted to the server computing device 210.

The client computing device 230 can further include a rotater 242. The rotater 242 can rotate a vector by a random rotation matrix (e.g., by multiplying the vector by the matrix). In some implementations, the rotater 242 can determine the random rotation matrix based on a seed.

The client computing device 230 can further include a quantizer 246. The quantizer 246 can quantize a vector. For example, the quantizer 246 can perform stochastic binary quantization or stochastic k-level quantization as described above to quantize the vector.

The client computing device 230 can further include an encoder 248. For example, the encoder 248 can perform one or more of the encoding techniques described above (e.g., variable length coding such as, for example, Huffman coding or arithmetic coding).

The data 236 can include data examples to be used in solving one or more optimization problems. In some applications, the data examples of each client device 230 can be distributed unevenly among the client devices, such that no client device 230 includes a representative sample of the overall distribution of the training data examples. The data 236 can further include a vector to be communicated to the server 210.

The client device 230 of FIG. 4 can include various input/output devices for providing and receiving information from a user, such as a touch screen, touch pad, data entry keys, speakers, and/or a microphone suitable for voice recognition.

The client device 230 can also include a network interface 250 used to communicate with one or more remote computing devices (e.g. server 210) over the network 280. The network interface 250 can include any suitable components for interfacing with one more networks, including for example, transmitters, receivers, ports, controllers, antennas, or other suitable components.

The network 280 can be any type of communications network, such as a local area network (e.g. intranet), wide area network (e.g. Internet), cellular network, or some combination thereof. The network 280 can also include a direct connection between a client device 230 and the server 210. In general, communication between the server 210 and a client device 230 can be carried via network interface using any type of wired and/or wireless connection, using a variety of communication protocols (e.g. TCP/IP, HTTP, SMTP, FTP), encodings or formats (e.g. HTML, XML), and/or protection schemes (e.g. VPN, secure HTTP, SSL).

The vector calculator 240, the rotater 242, the quantizer 246, the encoder 248, the de-rotater 220, the decoder 222, and the mean calculator 224 can include computer logic utilized to provide desired functionality. Thus, each of vector calculator 240, the rotater 242, the quantizer 246, the encoder 248, the de-rotater 220, the decoder 222, and the mean calculator 224 can be implemented in hardware, firmware and/or software controlling a general purpose processor. In some implementations, each of vector calculator 240, the rotater 242, the quantizer 246, the encoder 248, the de-rotater 220, the decoder 222, and the mean calculator 224 includes program code files stored on the storage device, loaded into memory and executed by a processor or can be provided from computer program products, for example, computer executable instructions that are stored in a tangible computer-readable storage medium such as, for example, a RAM disk or card or other computer-readable optical or magnetic media.

Furthermore, while the techniques of the present disclosure are discussed primarily with reference to vectors to be transmitted or uploaded, the techniques described herein can also be applied to other data structures as well. As an example, for any other type of data to be transmitted by the client computing device 230 (e.g., a matrix (2D), a tensor (3D and above), or other data types or structures), the client computing device 230 (e.g., the vector calculator 240) can first flatten the data structure to form a vector. The techniques described herein (e.g., random rotation, probabilistic quantization, and/or variable length coding) can then be applied to the vector. After the entire process (e.g., after de-rotation, decoding, and/or mean estimation), the server computing device 210 can re-shape the resulting vector (e.g., a mean vector) back to the original dimension(s).

Thus, the present disclosure can be generalized to other data structures through conversion (e.g., flattening) of the other data structure to vector format prior to rotation, quantization, encoding, etc. After de-rotation, decoding, etc., the de-rotated or decoded vector can be reshaped back into the original dimension(s).

10. Example Methods

Figure 5:
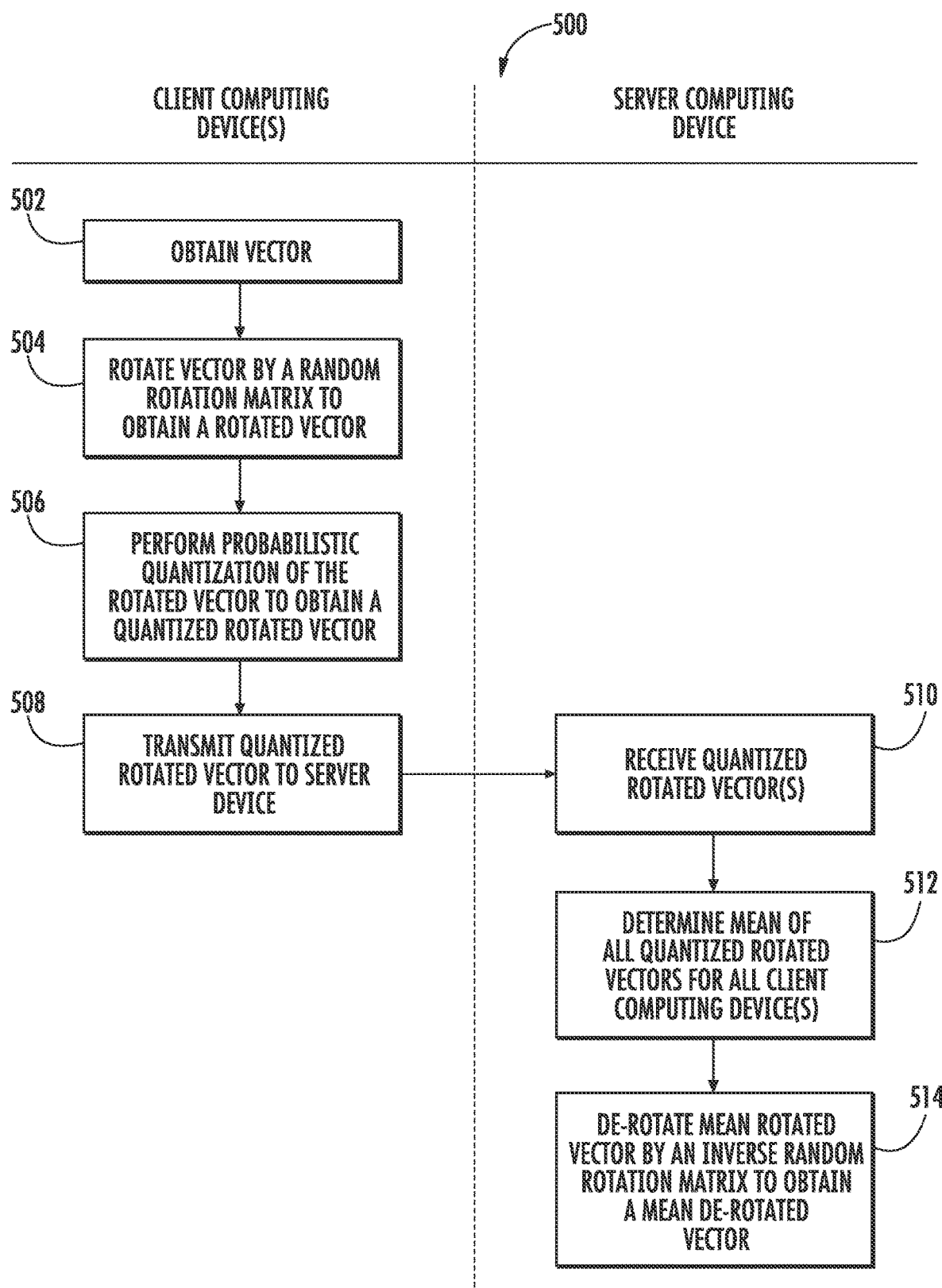
FIG. 5 depicts a swim lane flow diagram of an example method to perform a stochastic rotated quantization technique according to example embodiments of the present disclosure.

FIG. 5 depicts a swim lane flow diagram of an example method 500 to perform a stochastic rotated quantization technique according to example embodiments of the present disclosure. In particular, the left-hand side of FIG. 5 illustrates operations performed by each of one or more client computing devices while the right-hand side of FIG. 5 illustrates operations performed by a server computing device.

At 502, a client computing device obtains a vector. The vector can be any vector that is to be transmitted to the server computing device. Example vectors include a machine-learned model update vector that describes one or more parameters of a machine-learned model or one or more updates to the one or more parameters of the machine-learned model; a cluster vector that describes a plurality of cluster centers or a plurality of updates to the plurality of cluster centers; and a power iteration vector that describes an eigenvector. In some implementations, obtaining the vector can include computing the vector based on a local dataset that is stored locally at the client computing device.

At 504, the client computing device rotates the vector by a random rotation matrix to obtain a rotated vector. As an example, in some implementations, the random rotation matrix can be a product of a Walsh-Hadamard matrix with a diagonal matrix. In some implementations, the diagonal matrix can include independent and identically distributed Rademacher entries.

In some implementations, the method 500 can further include obtaining a seed that is shared with the server computing device. The method 500 can include generating the random rotation matrix based at least in part on the seed.

At 506, the client computing device performs probabilistic quantization of the rotated vector to obtain a quantized rotated vector. For example, in some implementations, performing probabilistic quantization at 506 can include performing stochastic binary quantization or performing stochastic k-level quantization.

In some implementations, performing probabilistic quantization at 506 can include determining a value for each of a number of quantization levels based at least in part on a magnitude of the rotated vector and a minimum coordinate value included in the rotated vector; and quantizing each coordinate of the rotated vector into one of the number of quantization levels.

At 508, the client computing device transmits the quantized rotated vector to the server computing device. In some implementations, various additional encodings, cryptography, and/or privacy preserving manipulations can be performed prior to transmission.

At 510, the server computing device receives the quantized rotated vectors from the client computing devices. In some implementations, at 510, the server computing device can decode or unquantize each quantized rotated vector to the extent possible. For example, this may include transforming references or codings into particular data entries to which the references refer.

At 512, the server computing device determines a mean of all the quantized rotated vectors received from all of the client computing devices to obtain a mean rotated vector.

At 514, the server computing device de-rotates the mean rotated vector by an inverse random rotation matrix to obtain a mean de-rotated vector. For example, the inverse random rotation matrix can be the inverse of the random rotation matrix used at 504.

In some implementations, method 500 can include obtaining, by the server computing device, a seed, where the seed is shared with at least one of the client computing devices from which a quantized rotated vector is received. For example, each client computing device can have a different seed or seeds can be used by multiple client computing devices. The method 500 can include generating, by the server computing device, the inverse random rotation matrix based at least in part on the seed.

In some implementations, the operations illustrated at 512 and 514 can be performed in reverse order, such that the vectors are individually de-rotated prior to taking the mean.

In some implementations, the method 500 can further include performing, by the server computing device, a global update based on the mean de-rotated vector.

Figure 6:
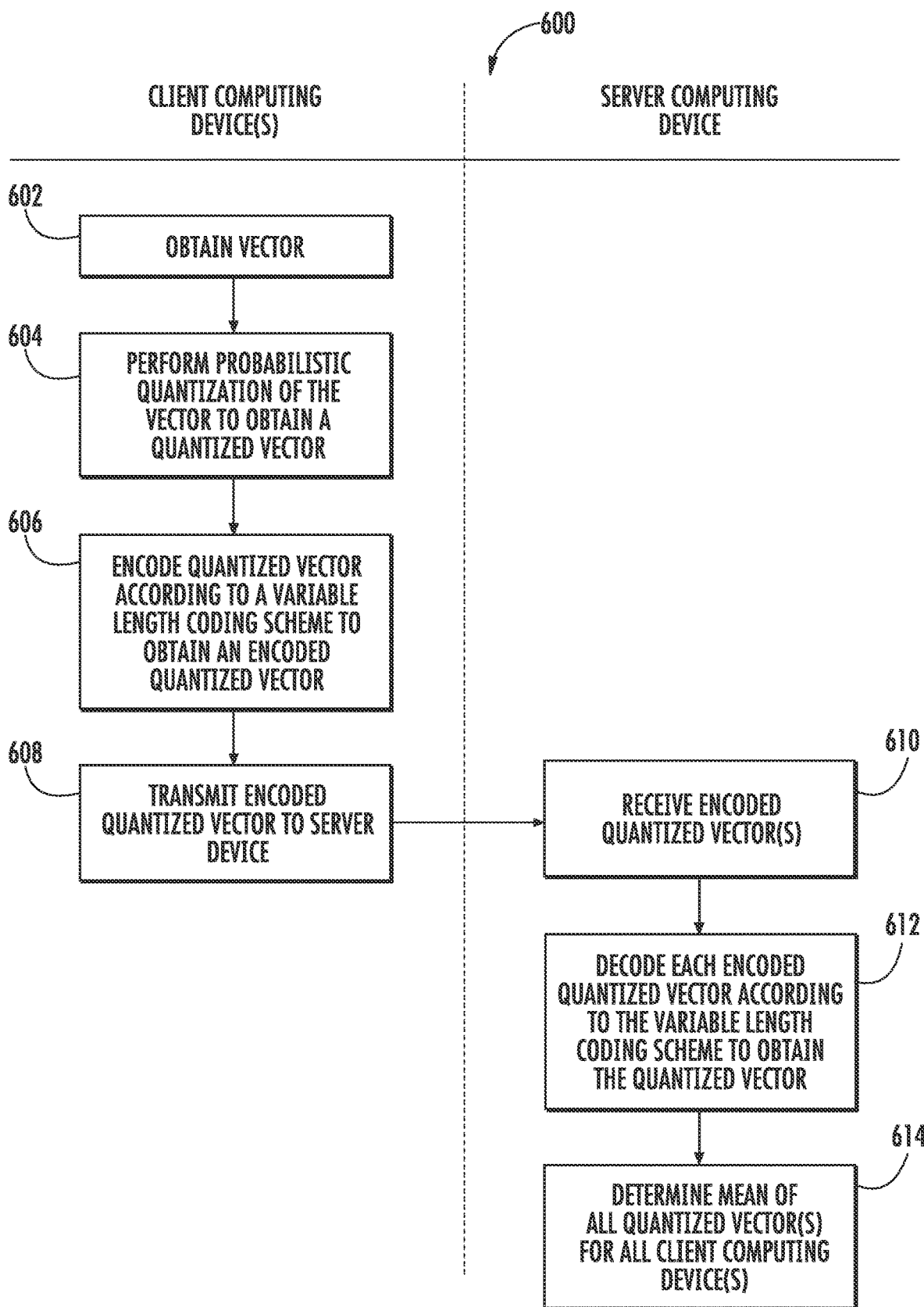
FIG. 6 depicts a swim lane flow diagram of an example method to perform a variable length coding technique according to example embodiments of the present disclosure.

FIG. 6 depicts a swim lane flow diagram of an example method 600 to perform a variable length coding technique according to example embodiments of the present disclosure. In particular, the left-hand side of FIG. 6 illustrates operations performed by each of one or more client computing devices while the right-hand side of FIG. 6 illustrates operations performed by a server computing device.

At 602, a client computing device obtains a vector. The vector can be any vector that is to be transmitted to the server computing device. Example vectors include a machine-learned model update vector that describes one or more parameters of a machine-learned model or one or more updates to the one or more parameters of the machine-learned model; a cluster vector that describes a plurality of cluster centers or a plurality of updates to the plurality of cluster centers; and a power iteration vector that describes an eigenvector. In some implementations, obtaining the vector can include computing the vector based on a local dataset that is stored locally at the client computing device.

At 604, the client computing device performs probabilistic quantization of the vector to obtain a quantized vector. For example, in some implementations, performing probabilistic quantization at 604 can include performing stochastic binary quantization or performing stochastic k-level quantization.

In some implementations, performing probabilistic quantization at 604 can include determining a value for each of a number of quantization levels based at least in part on a magnitude of the vector to be quantized and a minimum coordinate value included in the vector; and quantizing each coordinate of the vector into one of the number of quantization levels.

At 606, the client computing device encodes the quantized vector according to a variable length coding scheme to obtain an encoded quantized vector. For example, the variable length coding scheme can include Huffman coding or arithmetic coding.

At 608, the client computing device transmits the encoded quantized vector to the server computing device.

At 610, the server computing device receives the encoded quantized vectors from the client computing devices.

At 612, the server computing device decodes each encoded quantized vector according to the variable length coding scheme to obtain the quantized vector.

In addition, in some implementations, at 612 and after decoding with the variable length coding scheme, the server computing device can decode or unquantize each quantized rotated vector to the extent possible. For example, this may include transforming references or codings into particular data entries to which the references refer.

At 614, the server computing device determines a mean of all the quantized vectors received from all of the client computing devices to obtain a mean vector.

In some implementations, the method 600 can further include performing, by the server computing device, a global update based on the mean de-rotated vector.

11. Additional Disclosure

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A computing system that performs stochastic quantization to facilitate efficient transmission of machine-learned model updates from client devices to a centralized server computing device, the computing system comprising:
    one or more client computing devices, wherein each client computing device comprises one or more processors and one or more non-transitory computer-readable media that store instructions that, when executed by the one or more processors cause the client computing device to perform operations, the operations comprising:
        determining an update to a machine-learned model based at least in part on a local dataset stored at the client computing device, wherein the update comprises a plurality of coordinate values;
        performing quantization of the update to obtain a quantized update, wherein performing quantization of the update comprises:
            establishing a plurality of quantization levels;
            respectively quantizing each coordinate value of the plurality of coordinate value into one of the plurality of quantization levels according to a respective probability determined based on the coordinate value; and
            encoding the quantized update according to a variable length coding scheme; and
        transmitting the quantized update to the centralized server computing device.

2. The computing system of claim 1, wherein performing quantization of the update comprises:
    performing probabilistic quantization of the update.

3. The computing system of claim 1, wherein performing quantization of the update comprises:
    performing stochastic binary quantization of the update.

4. The computing system of claim 1, wherein performing quantization of the update comprises:
    performing stochastic k-level quantization of the update.

5. The computing system of claim 1, wherein:
    the update includes a vector having the plurality of coordinate values; and
    performing quantization of the update comprises:
        determining a value for each of the plurality of quantization levels based at least in part on a magnitude of the vector to be quantized and a minimum coordinate value included in the vector; and
quantizing each coordinate of the vector into one of the plurality of quantization levels.

6. The computing system of claim 1, further comprising:
the centralized server computing device, the centralized server computing device comprising one or more processors and one or more non-transitory computer-readable media that store instructions that, when executed by the one or more processors cause the centralized server computing device computing to perform operations, the operations comprising:
for each of the one or more client computing devices:
receiving the quantized update transmitted by the client computing device; and
decoding the quantized update according to the variable length coding scheme to obtain the quantized update for such client computing device;
determining a mean of all quantized updates obtained for all of the one or more client computing devices; and
updating a global machine-learned model based at least in part on the mean of all quantized updates.

7. The computing system of claim 1, wherein the variable length coding scheme comprises Huffman coding or arithmetic coding.

8. The computing system of claim 1, wherein the update comprises one or more of:
a machine-learned model update vector that describes one or more parameters of a machine-learned model or one or more updates to the one or more parameters of the machine-learned model;
a cluster vector that describes a plurality of cluster centers or a plurality of updates to the plurality of cluster centers; and
a power iteration vector that describes an eigenvector.

9. The computing system of claim 1, wherein:
the plurality of quantization levels comprises two quantization levels; and
transmitting the quantized update to the centralized server computing device comprises transmitting:
two real values that correspond to the two quantization levels; and
a bit vector of length equal to a number of coordinate values in the update, wherein each bit in the bit vector corresponds to a respective one of the plurality of coordinate values.

10. The computing system of claim 1, wherein the operations further comprise:
identifying a minimum value among the plurality of coordinate values of the update; and
setting a first quantization level of the plurality of quantization levels equal to the minimum value among the plurality of coordinate values.

11. The computing system of claim 10, wherein performing quantization further comprises:
identifying a maximum value among the plurality of coordinate values of the update; and
setting a second quantization level of the plurality of quantization levels equal to the maximum value among the plurality of coordinate values.

12. The computing system of claim 1, wherein the plurality of quantization levels comprises three or more quantization levels.

13. The computing system of claim 1, wherein the update to the machine-learned model comprises a gradient associated with training of the machine-learned model.

14. A computer-implemented method, comprising:
determining, by a computing system comprising one or more computing devices, an update to a machine-learned model based at least in part on a local dataset stored at a client computing device, wherein the update comprises a plurality of coordinate values;
performing, by the computing system, quantization of the update to obtain a quantized update, wherein performing quantization of the update comprises:
establishing, by the computing system, a plurality of quantization levels; and
respectively quantizing, by the computing system, each coordinate value of the plurality of coordinate value into one of the plurality of quantization levels according to a respective probability determined based on the coordinate value;
encoding the quantized update according to a variable length coding scheme; and
transmitting, by the computing system, the quantized update to a centralized server computing device.

15. The computer-implemented method of claim 14, wherein performing quantization of the update comprises:
performing stochastic quantization of the update.

16. The computer-implemented method of claim 14, wherein:
the update includes a vector having the plurality of coordinate values; and
performing quantization of the update comprises:
determining a value for each of the plurality of quantization levels based at least in part on a magnitude of the vector to be quantized and a minimum coordinate value included in the vector; and
quantizing each coordinate of the vector into one of the plurality of quantization levels.

17. The computer-implemented method of claim 14, wherein the update comprises one or more of:
a machine-learned model update vector that describes one or more parameters of a machine-learned model or one or more updates to the one or more parameters of the machine-learned model;
a cluster vector that describes a plurality of cluster centers or a plurality of updates to the plurality of cluster centers; and
a power iteration vector that describes an eigenvector.

18. The computer-implemented method of claim 14, further comprising:
identifying a minimum value among the plurality of coordinate values of the update; and
setting a first quantization level of the plurality of quantization levels equal to the minimum value among the plurality of coordinate values.

19. The computer-implemented method of claim 14, wherein performing quantization further comprises:
identifying a maximum value among the plurality of coordinate values of the update; and
setting a second quantization level of the plurality of quantization levels equal to the maximum value among the plurality of coordinate values.

20. The computer-implemented method of claim 14, wherein the plurality of quantization levels comprises three or more quantization levels.

* * * * *